United States Patent
Yoshikawa et al.

(10) Patent No.: US 10,784,080 B2
(45) Date of Patent: Sep. 22, 2020

(54) MULTIPLE CHARGED PARTICLE BEAM WRITING APPARATUS, AND MULTIPLE CHARGED PARTICLE BEAM WRITING METHOD

(71) Applicant: NuFlare Technology, Inc., Yokohama (JP)

(72) Inventors: Ryoichi Yoshikawa, Kawasaki (JP); Hideo Inoue, Miura-gun (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/363,487

(22) Filed: Mar. 25, 2019

(65) Prior Publication Data
US 2019/0304749 A1    Oct. 3, 2019

(30) Foreign Application Priority Data

Mar. 29, 2018    (JP) .................................. 2018-063810

(51) Int. Cl.
*H01J 37/304* (2006.01)
*H01J 37/31* (2006.01)
*H01J 37/317* (2006.01)

(52) U.S. Cl.
CPC ........ *H01J 37/3177* (2013.01); *H01J 37/304* (2013.01); *H01J 2237/0435* (2013.01);
(Continued)

(58) Field of Classification Search
CPC ........... H01J 37/3177; H01J 2237/0435; H01J 2237/31774; H01J 37/045; H01J 37/3026; H01J 37/3174; H01J 2237/024; H01J 2237/2817; H01J 2237/30472; H01J 37/28; H01J 37/3045; H01J 2237/0216;
(Continued)

(56) References Cited

U.S. PATENT DOCUMENTS 7,105,842 B2   9/2006   Tanimoto et al.
8,729,507 B2   5/2014   Yoshikawa et al.
(Continued)

FOREIGN PATENT DOCUMENTS

JP   2005-116743   4/2005
JP   2013-128032   6/2013
(Continued)

*Primary Examiner* — David A Vanore
(74) *Attorney, Agent, or Firm* — Oblon, McClelland, Maier & Neustadt, L.L.P.

(57) ABSTRACT

A multiple charged particle beam writing apparatus includes a defective pattern data generation circuitry configured to generate defective pattern data of a defective pattern having a shape of the defective region in the writing region; a reverse pattern data generation circuitry configured to generate reverse pattern data by reversing the defective pattern data; a combined-value pixel data generation circuitry configured to generate, for the each pixel, combined-value pixel data by adding a value defined in a reverse pattern pixel data and a value defined in a writing pattern pixel data; and a writing mechanism configured to perform multiple writing, using multiple charged particle beams, on the target object such that the each pixel is irradiated with a beam of a dose corresponding to a value defined in the combined-value pixel data.

14 Claims, 20 Drawing Sheets

(52) U.S. Cl.
CPC ............... *H01J 2237/30472* (2013.01); *H01J 2237/31774* (2013.01); *H01J 2237/31798* (2013.01)

(58) Field of Classification Search
CPC ....... H01J 2237/0432; H01J 2237/0437; H01J 2237/15; H01J 2237/1536; H01J 2237/202; H01J 2237/20214; H01J 2237/20228; H01J 2237/22
USPC .................................. 250/492.3, 311, 492.1
See application file for complete search history.

(56) References Cited

U.S. PATENT DOCUMENTS

| | | | |
|---|---|---|---|
| 8,741,547 B2 | 6/2014 | Yoshikawa et al. | |
| 8,772,734 B2 | 7/2014 | Yamanaka | |
| 9,076,564 B2 | 7/2015 | Yoshikawa et al. | |
| 9,548,183 B2* | 1/2017 | Yashima | H01J 37/1472 |
| 9,869,650 B2* | 1/2018 | Kikuiri | H01J 37/244 |
| 10,020,165 B2 | 7/2018 | Matsumoto | |
| 2008/0245965 A1* | 10/2008 | Sugiyama | B82Y 10/00 |
| | | | 250/311 |
| 2014/0124684 A1* | 5/2014 | Matsumoto | H01J 37/3174 |
| | | | 250/492.3 |
| 2015/0254393 A1* | 9/2015 | Fujimura | H01J 37/3175 |
| | | | 250/492.22 |
| 2019/0198290 A1* | 6/2019 | Inoue | H01J 37/147 |
| 2019/0198294 A1* | 6/2019 | Inoue | H01J 37/045 |
| 2019/0304748 A1* | 10/2019 | Yoshikawa | H01J 37/3177 |
| 2019/0304749 A1* | 10/2019 | Yoshikawa | H01J 37/304 |

FOREIGN PATENT DOCUMENTS

| | | |
|---|---|---|
| JP | 2013-135166 | 7/2013 |
| JP | 2014-7379 | 1/2014 |
| JP | 2017-73461 | 4/2017 |

\* cited by examiner

Shape of unnecessary irradiation to be corrected

Shape of unnecessary irradiation to be corrected

FIG.15A

Defective — Once

|  |  |  |  |  |  |
|---|---|---|---|---|---|
|  | 1/8 |  |  |  |  |
|  |  |  |  |  |  |
|  |  |  |  |  |  |
|  |  |  |  | 1/8 |  |
|  |  |  |  |  |  |

Defective ↗ 1/8

FIG.15C

Pattern — Eight Times

|  |  |  |  |  |
|---|---|---|---|---|
|  | 1/8 | 1/8 |  |  |
|  | 1/8 | 1/8 |  |  |
|  | 1/8 | 1/8 |  |  |
|  |  |  |  |  |
|  |  |  |  |  |

FIG.15B

Eight Times

| 1/64 | 1/64 | 1/64 | 1/64 | 1/64 |
|---|---|---|---|---|
| 1/64 | 0 | 1/64 | 1/64 | 1/64 |
| 1/64 | 1/64 | 1/64 | 1/64 | 1/64 |
| 1/64 | 1/64 | 1/64 | 1/64 | 1/64 |
| 1/64 | 1/64 | 1/64 | 1/64 | 0 |
| 1/64 | 1/64 | 1/64 | 1/64 | 1/64 |

FIG.15D

Total

| 1/8 | 1/8 | 1/8 | 1/8 | 1/8 |
|---|---|---|---|---|
| 1/8 | 9/8 | 9/8 | 1/8 | 1/8 |
| 1/8 | 9/8 | 9/8 | 1/8 | 1/8 |
| 1/8 | 9/8 | 9/8 | 1/8 | 1/8 |
| 1/8 | 1/8 | 1/8 | 1/8 | 1/8 |
| 1/8 | 1/8 | 1/8 | 1/8 | 1/8 |

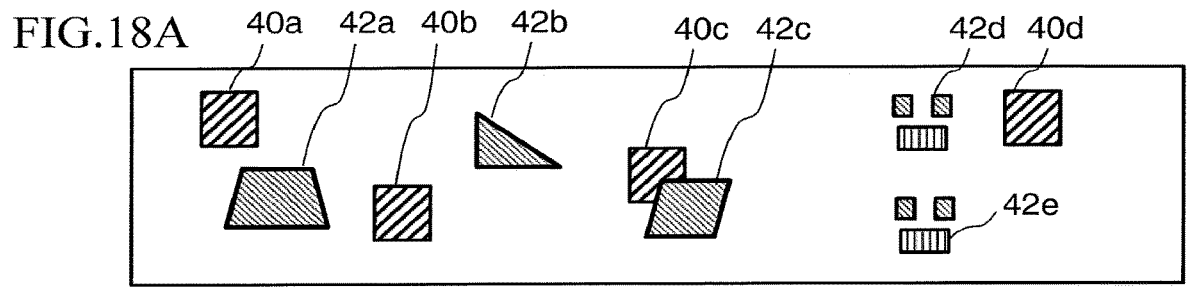
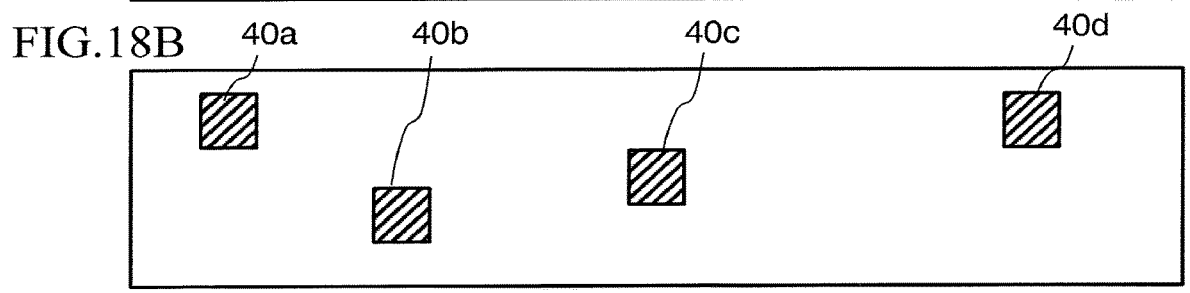
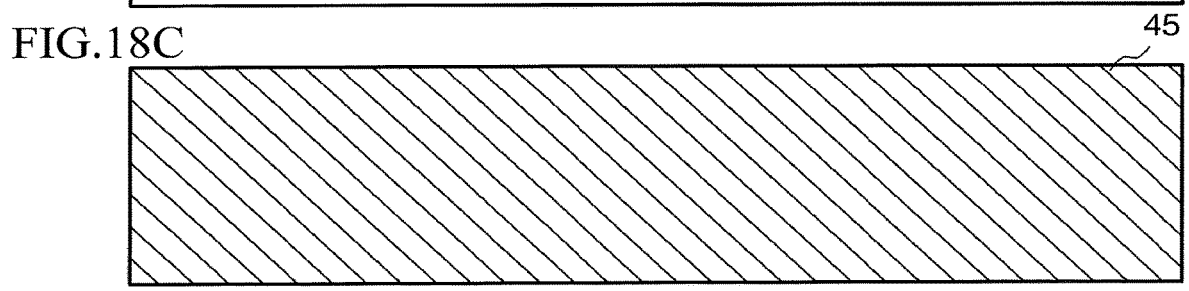
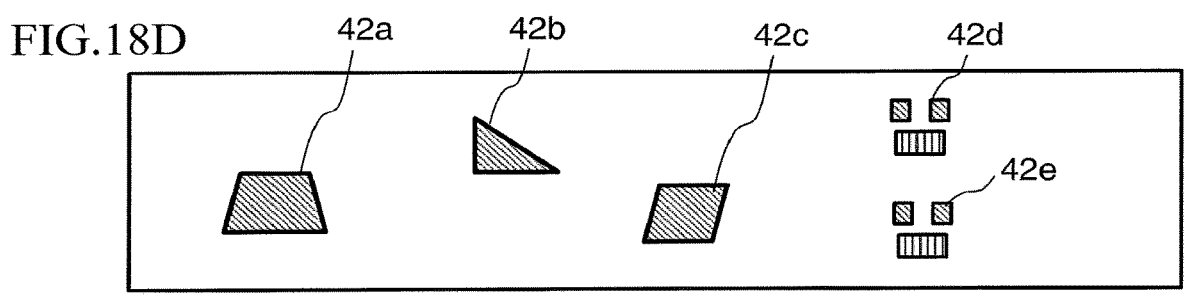
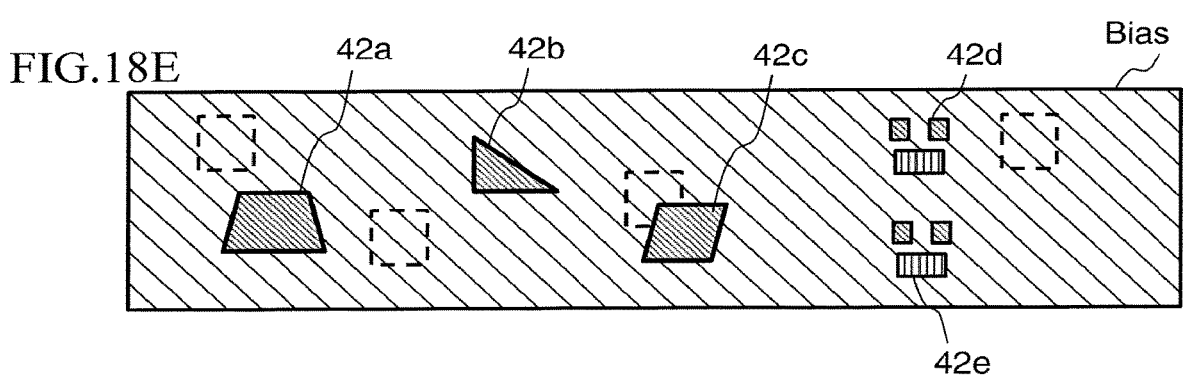

FIG.20A
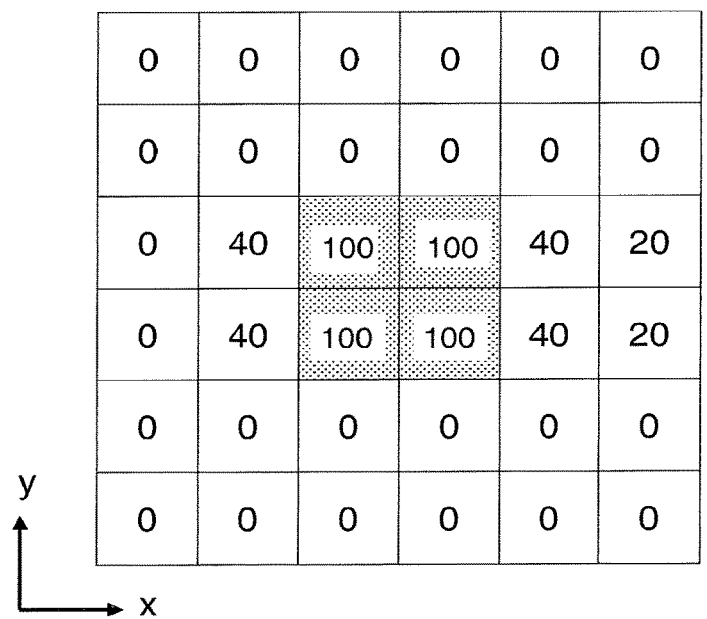
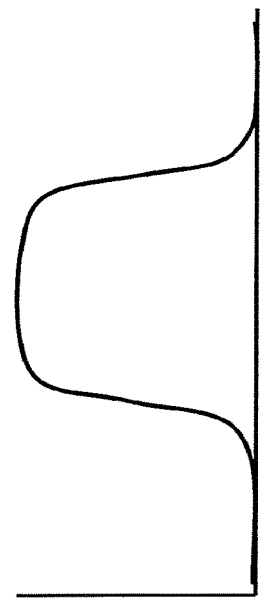
FIG.20C
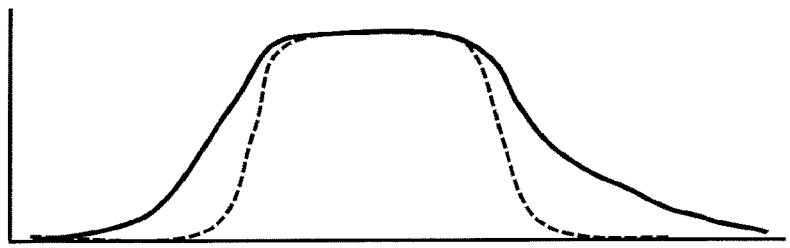
FIG.20B

MULTIPLE CHARGED PARTICLE BEAM WRITING APPARATUS, AND MULTIPLE CHARGED PARTICLE BEAM WRITING METHOD

CROSS-REFERENCE TO RELATED APPLICATION

This application is based upon and claims the benefit of priority from prior Japanese Patent Application No. 2018-063810 filed on Mar. 29, 2018 in Japan, the entire contents of which are incorporated herein by reference.

BACKGROUND OF THE INVENTION

Field of the Invention

Embodiments of the present invention relate to a multiple charged particle beam writing apparatus and a multiple charged particle beam writing method, and, for example, relate to a beam irradiation method in multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In multi-beam writing, the dose of each beam is individually controlled based on the irradiation time. Therefore, individual blanking mechanisms which can individually control on/off of each beam are arranged in an array. If the number of beams increases, uncontrollable defective beams may be generated. For example, an always-off beam which is unable to be emitted, and an always-on beam which is uncontrollable to be off are generated. If the defective beam is an always-off beam, another beam can be a substitute to irradiate the target object surface. However, it is difficult to take measures against an always-on beam.

In order to solve this problem, there is proposed a method of performing multiple writing using the dose obtained by adding a uniform offset dose Doff to the dose of each pixel after pixelating (or rasterizing) a figure pattern (e.g., refer to Japanese Patent Application Laid-open (JP-A) No. 2017-073461). For example, with respect to a pixel which is irradiated with an always-on beam, one of M time exposures is performed with the always-on beam (defective beam), and the remaining M−1 time exposures are performed with normal beams. In contrast, with respect to a pixel which is not irradiated with an always-on beam, M time exposures are performed with normal beams using the dose after adding the offset dose. However, in the case of employing this method, for example, if the pixel position and the pattern position irradiated with an always-on beam are displaced from each other, the correction accuracy becomes degraded.

As other countermeasures against the always-on beam, there is a method of physically blocking the region including the always-on beam with a shutter, etc. However, providing a shutter mechanism needs a structure which accurately drives and controls the shutter, and causes a problem of significantly reducing the throughput because the number of beams decreases since, depending on the position of a defective beam, the shutter and the like may largely restrict a target region. Moreover, there is a method of occluding an aperture hole of a target portion, but problems may occur as follows: In the case of taking an aperture member with the aperture hole from the apparatus and performing occlusion processing for it, the machine is down for a long time during the processing period, thereby decreasing the operating rate. Furthermore, if providing a means for occluding the aperture hole by using ion beams, etc. at the optical column, a very complicated mechanism is needed, thereby being unrealistic. Also, although there is a method of providing a two-stage blanking deflection for cutting off or blocking a beam by using either one of the deflection stages, since two-stage complicated blanking deflection arrays are needed, the mechanism inevitably becomes complicated.

BRIEF SUMMARY OF THE INVENTION

According to one aspect of the present invention, a multiple charged particle beam writing apparatus includes:

a defective region specifying circuitry configured to specify a defective region to be irradiated with a defective beam which has a probability of delivering a dose being larger than a control dose and including an unnecessary dose, in a writing region of a target object;

a defective pattern data generation circuitry configured to generate defective pattern data of a defective pattern having a shape of the defective region in the writing region;

a reverse pattern data generation circuitry configured to generate reverse pattern data by reversing the defective pattern data;

a reverse pattern data conversion circuitry configured to convert the reverse pattern data into reverse pattern pixel data which defines a value corresponding to a dose for each pixel;

a writing pattern data conversion circuitry configured to convert writing pattern data which defines a figure pattern to be written into writing pattern pixel data which defines a value corresponding to a dose for the each pixel;

a combined-value pixel data generation circuitry configured to generate, for the each pixel, combined-value pixel data by adding the value defined in the reverse pattern pixel data and the value defined in the writing pattern pixel data; and a writing mechanism configured to perform multiple writing, using multiple charged particle beams, on the target object such that the each pixel is irradiated with a beam of a dose corresponding to a value defined in the combined-value pixel data.

According to another aspect of the present invention, a multiple charged particle beam writing apparatus includes:

a defective region specifying circuitry configured to specify a defective region to be irradiated with a defective beam which has a probability of delivering a dose being larger than a control dose and including an unnecessary dose, in a writing region of a target object;

a defective pattern data generation circuitry configured to generate defective pattern data of a defective pattern having a shape of the defective region in the writing region;

a solid pattern data generation circuitry configured to generate solid pattern data in which a whole of the writing region is regarded as a pattern;

a defective pattern data conversion circuitry configured to convert the defective pattern data into defective pattern pixel data which defines a value corresponding to a dose for each pixel;

a writing pattern data conversion circuitry configured to convert writing pattern data which defines a figure pattern to be written into writing pattern pixel data which defines a value corresponding to a dose for the each pixel;

a solid pattern data conversion circuitry configured to convert the solid pattern data into solid pattern pixel data which defines a value corresponding to a dose for the each pixel;

a combined-value pixel data generation circuitry configured to generate, for the each pixel, combined-value pixel data by adding the value defined in the solid pattern pixel data and the value defined in the writing pattern pixel data, and subtracting the value defined in the defective pattern pixel data; and a writing mechanism configured to perform multiple writing, using multiple charged particle beams, on the target object such that the each pixel is irradiated with a beam of a dose corresponding to a value defined in the combined-value pixel data.

According to yet another aspect of the present invention, a multiple charged particle beam writing method includes:

specifying a defective region to be irradiated with a defective beam which has a probability of delivering a dose being larger than a control dose and including an unnecessary dose, in a writing region of a target object;

generating defective pattern data of a defective pattern having a shape of the defective region in the writing region;

generating reverse pattern data by reversing the defective pattern data;

converting the reverse pattern data into reverse pattern pixel data which defines a value corresponding to a dose for each pixel;

converting writing pattern data which defines a figure pattern to be written into writing pattern pixel data which defines a value corresponding to a dose for the each pixel;

generating, for the each pixel, combined-value pixel data by adding the value defined in the reverse pattern pixel data and the value defined in the writing pattern pixel data; and performing multiple writing, using multiple charged particle beams, on the target object such that the each pixel is irradiated with a beam of a dose corresponding to a value defined in the combined-value pixel data.

According to yet another aspect of the present invention, a multiple charged particle beam writing method includes:

specifying a defective region to be irradiated with a defective beam which has a probability of delivering a dose being larger than a control dose and including an unnecessary dose, in a writing region of a target object;

generating defective pattern data of a defective pattern having a shape of the defective region in the writing region;

generating solid pattern data in which a whole of the writing region is regarded as a pattern;

converting the defective pattern data into defective pattern pixel data which defines a value corresponding to a dose for each pixel;

converting writing pattern data which defines a figure pattern to be written into writing pattern pixel data which defines a value corresponding to a dose for the each pixel;

converting the solid pattern data into solid pattern pixel data which defines a value corresponding to a dose for the each pixel;

generating, for the each pixel, combined-value pixel data by adding the value defined in the solid pattern pixel data and the value defined in the writing pattern pixel data, and subtracting the value defined in the defective pattern pixel data; and performing multiple writing, using multiple charged particle beams, on the target object such that the each pixel is irradiated with a beam of a dose corresponding to a value defined in the combined-value pixel data.

BRIEF DESCRIPTION OF THE DRAWINGS

FIGS. 15A to 15D illustrate examples of dose correction by multiple writing according to the first embodiment;

FIGS. 18A to 18E show examples of patterns at each stage in a writing method according to the second embodiment;

FIGS. 20A to 20C show other example of pattern at a stage of the writing method according to the first embodiment.

DETAILED DESCRIPTION OF THE INVENTION

Embodiments of the present invention describe a writing apparatus and method that can perform writing with great accuracy even if there is generated in multiple beams a defective beam, such as an always-on beam, which may irradiate a target with a dose being larger than a control dose and including an unnecessary dose.

Embodiments below describe a configuration in which an electron beam is used as an example of a charged particle beam. The charged particle beam is not limited to the electron beam, and other charged particle beam such as an ion beam may also be used.

First Embodiment

Figure 1:
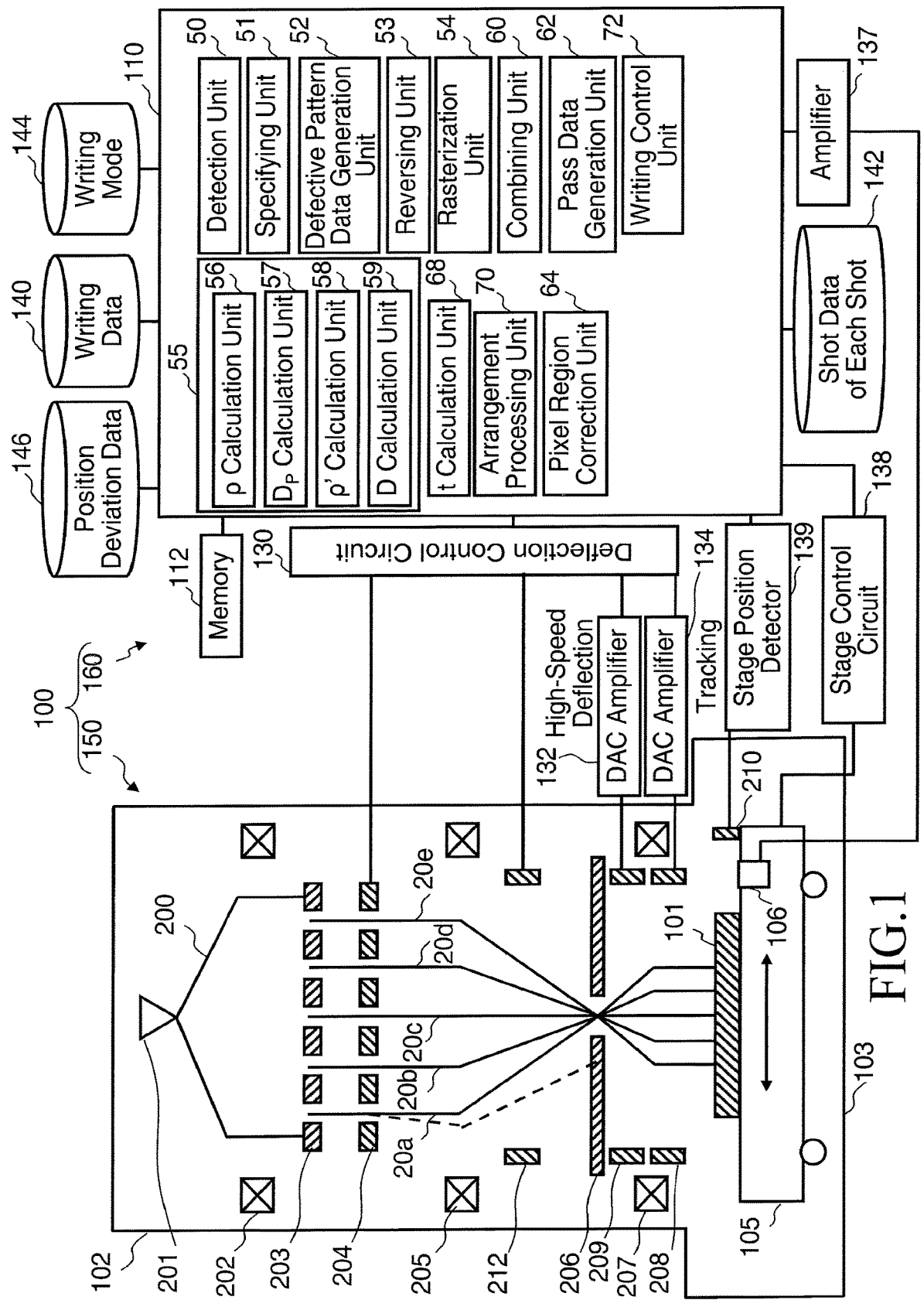
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control system circuit 160. The writing apparatus 100 is an example of a multiple charged particle beam writing apparatus. The writing mechanism 150 includes an electron optical column 102 and a writing chamber 103. In the electron optical column 102, there are disposed an electron gun 201, an illumination lens 202, a shaping aperture array substrate 203, a blanking aperture array mechanism 204, a reducing lens 205, a deflector 212, a limiting aperture substrate 206, an objective lens 207, and deflectors 208 and 209. In the writing chamber 103, an XY stage 105 is disposed. On the XY stage 105, a target object or "sample" 101 such as a mask serving as a writing target substrate is placed when writing is performed. The target object 101 is, for example, an exposure mask used for manufacturing semiconductor devices, or is a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 and a Faraday cup 106 for measuring a current are arranged on the XY stage 105.

The control system circuit 160 includes a control computer 110, a memory 112, a deflection control circuit 130, DAC (digital-analog converter) amplifier units 132 and 134, an amplifier 137, a stage control circuit 138, a stage position detector 139, and storage devices 140, 142, 144, and 146 such as magnetic disk drives. The control computer 110, the memory 112, the deflection control circuit 130, the amplifier 137, the stage control circuit 138, the stage position detector 139, and the storage devices 140, 142, 144, and 146 are connected with each other through a bus (not shown). Writing data is input from the outside of the writing apparatus 100 into the storage device 140 (storage unit) and stored therein. The deflection control circuit 130 is connected to the DAC amplifier circuits 132 and 134, and the blanking aperture array mechanism 204 through a bus (not shown). The stage position detector 139 irradiates the mirror 210 on the XY stage 105 with a laser beam, and receives a reflected light from the mirror 210. Then, the stage position detector 139 measures the position of the XY stage 105 by using information of the reflected light. The Faraday cup 106 is connected to the amplifier 137. A current amount signal, being an analog signal, detected by the Faraday cup 106 is converted into a digital signal and amplified by the amplifier 137 so as to be output to the control computer 110.

In the control computer 110, there are arranged a detection unit 50, a specifying unit 51, a defective pattern data generation unit 52, an reversing unit 53, a rasterization unit 54, a rasterization unit 55, a combining unit 60, a pass data generation unit 62, a pixel region correction unit 64, an irradiation time calculation unit 68, an arrangement processing unit 70, and a writing control unit 72. In the rasterization unit 55, there are arranged an area density calculation unit 56, a corrected irradiation coefficient calculation unit 57, an area density calculation unit 58, and a dose calculation unit 59. Each of the " . . . units" such as the detection unit 50, the specifying unit 51, the defective pattern data generation unit 52, the reversing unit 53, the rasterization unit 54, the rasterization unit 55 (area density calculation unit 56, corrected irradiation coefficient calculation unit 57, area density calculation unit 58, and dose calculation unit 59), the combining unit 60, the pass data generation unit 62, the pixel region correction unit 64, the irradiation time calculation unit 68, the arrangement processing unit 70, and the writing control unit 72 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the detection unit 50, the specifying unit 51, the defective pattern data generation unit 52, the reversing unit 53, the rasterization unit 54, the rasterization unit 55 (area density calculation unit 56, corrected irradiation coefficient calculation unit 57, area density calculation unit 58, and dose calculation unit 59), the combining unit 60, the pass data generation unit 62, the pixel region correction unit 64, the irradiation time calculation unit 68, the arrangement processing unit 70, and the writing control unit 72, and information being operated are stored in the memory 112 each time.

FIG. 1 shows a configuration necessary for describing the first embodiment. Other configuration elements generally necessary for the writing apparatus 100 may also be included therein.

Figure 2:
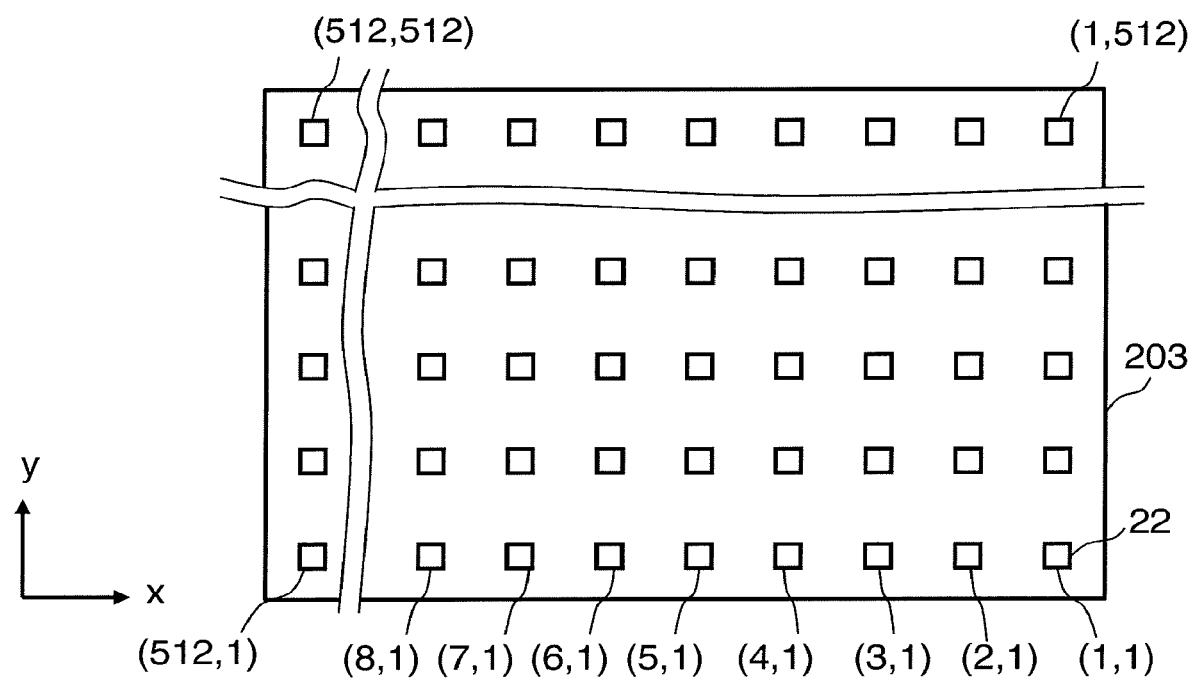
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of m rows long (length in the y direction) and n columns wide (width in the x direction) (m≥2, n≥2) are formed, like a matrix, at a predetermined arrangement pitch in the shaping aperture array substrate 203. In FIG. 2, for example, holes 22 of 512 (rows of holes arrayed in the y direction)×512 (columns of holes arrayed in the x direction) are formed. Each of the holes 22 is a rectangle (including a square) having the same dimension and shape. Alternatively, each of the holes 22 may be a circle with the same outer diameter. Multiple beams 20 are formed by letting portions of an electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged in a grid form in the length and width directions. For example, with respect to the k-th and the (k+1)th rows which are arrayed (accumulated) in the length direction (y direction) and each of which is in the x direction, each hole in the k-th row and each hole in the (k+1) th row may be mutually displaced in the width direction (x direction) by a dimension "a". Similarly, with respect to the (k+1)th and the (k+2)th rows which are arrayed (accumulated) in the length direction (y direction) and each of which is in the x direction, each hole in the (k+1)th row and each hole in the (k+2)th row may be mutually displaced in the width direction (x direction) by a dimension "b", for example.

Figure 3:
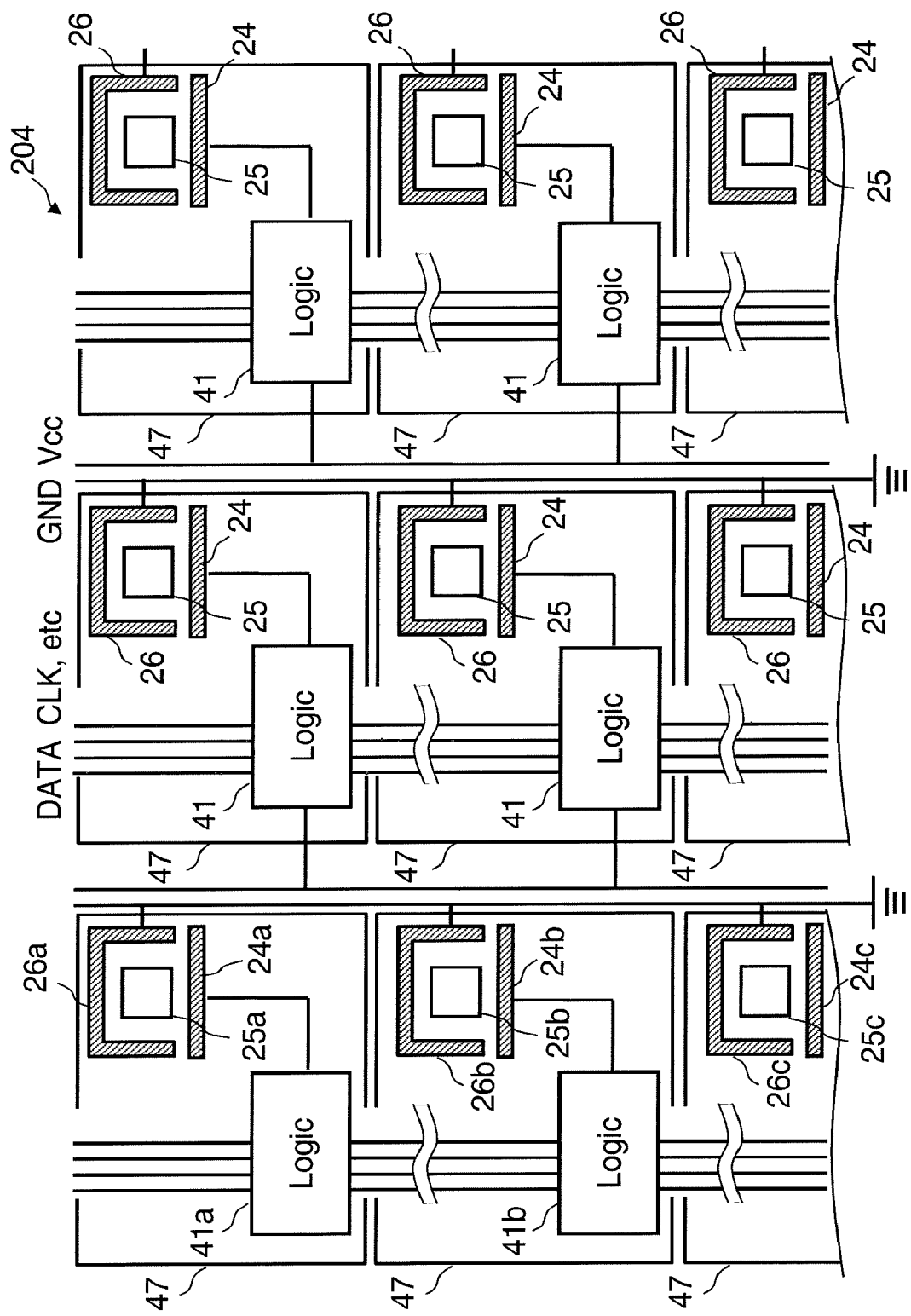
FIG. 3 is a top view conceptual diagram showing a part of a blanking aperture array mechanism according to the first embodiment.

FIG. 3 is a top view conceptual diagram showing a part of a blanking aperture array mechanism according to the first embodiment. In FIG. 3, the positional relation of electrodes 24 and 26 and that of a control circuit 41 are not in accordance with each other. As shown in FIG. 3, in the substrate of the blanking aperture array mechanism 204, there are formed passage holes 25 (openings), through which multiple beams individually pass, at the positions each corresponding to each hole 22 of the shaping aperture array member 203 of FIG. 2. Then, on the substrate of the blanking aperture array mechanism 204, a pair of electrodes 24 and 26 (blanker: blanking deflector) for blanking deflection is disposed close to a corresponding one of a plurality of passage holes 25 in a manner such that the electrodes 24 and 26 are opposite each other across the passage hole 25 concerned. Moreover, close to each passage hole 25, there is arranged the control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, n-bit lines of a required number, for a control signal, is connected to each control circuit 41. In addition to the n-bit lines, for example, a clock signal line, a power source line, and the like are connected to each control circuit 41. An individual blanking mechanism 47 composed of the electrodes 24 and 26 and the control circuit 41 is configured for each beam of multiple beams. A control signal for each control circuit 41 is output from the deflection control circuit 130. Moreover, a shift register (not shown) is disposed in each control circuit 41, and for example, shift registers in the control circuits for beams in one row of n×m multiple beams are connected in series. For example, control signals for beams in one row of the n×m multiple beams are transmitted in series, and a control signal for each beam is stored in a corresponding control circuit 41 by clock signals of n times.

The electron beam passing through a corresponding passage hole 25 is independently deflected by the voltage applied to the paired electrodes 24 and 26. Blanking control is performed by this deflection. Blanking deflection is performed for each corresponding one of the multiple beams 20. Thus, each of a plurality of blankers performs blanking deflection of a corresponding one of the multiple beams 20 having passed through a plurality of holes 22 (openings) in the shaping aperture array substrate 203.

The electron beam 200 emitted from the electron gun 201 (emission unit) almost perpendicularly (e.g., vertically) illuminates the whole of the shaping aperture array substrate 203 by the illumination lens 202. A plurality of rectangular holes (openings) have been formed in the shaping aperture array substrate 203, and the region including all the plurality of holes 22 is irradiated with the electron beam 200. For example, a plurality of rectangular (including square) electron beams (multiple beams) 20a to 20e are formed by letting portions of the electron beam 200, which irradiates the positions of a plurality of holes 22, individually pass through a corresponding one of the plurality of holes 22 in the shaping aperture array substrate 203. The multiple beams 20a to 20e individually pass through a corresponding blanker (individual blanking mechanism) of the blanking aperture array mechanism 204. Each blanker provides deflection (performs blanking deflection) of the electron beam 20, individually passing, in order to make it become beam "on" during the period of calculated writing time (irradiation time) and become beam "off" during the period except for the calculated time.

The multiple beams 20a to 20e having passed through the blanking aperture array mechanism 204 are reduced by the reducing lens 205, and go toward the hole in the center of the limiting aperture substrate 206. At this stage, the electron beam 20, which was deflected to be beam "off" by the blanker of the blanking aperture array mechanism 204, deviates (shifts) from the hole in the center of the limiting aperture substrate 206 (blanking aperture member) and is blocked by the limiting aperture substrate 206. On the other hand, the electron beam 20, which was not deflected by the blanker of the blanking aperture array mechanism 204 or deflected to be beam "on", passes through the hole in the center of the limiting aperture substrate 206 as shown in FIG. 1. Blanking control is carried out by on/off of the individual blanking mechanism so as to control on/off of beams. Thus, the limiting aperture substrate 206 blocks each beam which was deflected to be in the "off" state by the individual blanking mechanism. Then, one shot beam is formed by a beam which has been made during a period from becoming beam "on" to becoming beam "off" and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the deflectors 208 and 209 in order to irradiate respective writing positions (irradiation positions) on the target object 101. Ideally, the multiple beams 20 irradiating at a time are aligned at pitches obtained by multiplying the arrangement pitch of a plurality of holes in the shaping aperture array substrate 203 by the desired reduction ratio described above. The writing apparatus 100 performs a writing operation by a method of sequentially irradiating shot beams while shifting the writing position, and when writing a desired pattern, controls a beam required according to a pattern to be beam "on" by blanking control.

Figure 4:
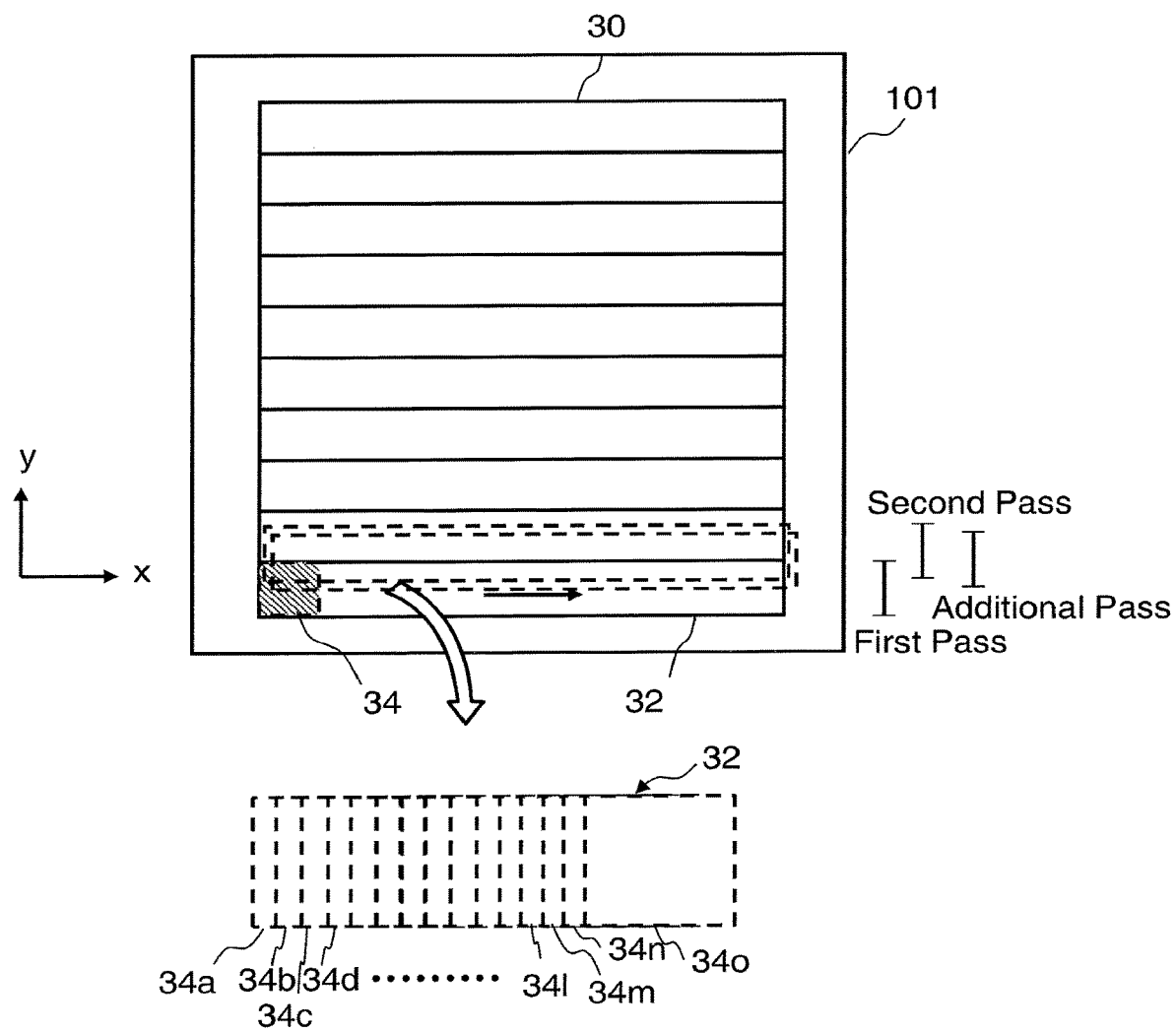
FIG. 4 is a conceptual diagram explaining an example of a writing operation according to the first embodiment.

FIG. 4 is a conceptual diagram explaining an example of a writing operation according to the first embodiment. In FIG. 4, the region of a chip pattern to be written on the target object 101 serves as a writing region 30 of the target object 101. In the case of a plurality of chips being simultaneously written, a merged chip pattern obtained by merging the plurality of chips into one chip serves as the writing region 30 of the target object 101. The writing region 30 is virtually divided into a plurality of stripe regions 32 each in the shape of a strip and each having a predetermined width in the y direction, for example. In the first embodiment, multiple writing is performed in a manner such that writing is carried out a plurality of times while shifting the position with respect to each region. FIG. 4 shows multiple writing of two pass writing (multiplicity=2) and one additional pass writing. First, the XY stage 105 is moved to make an adjustment such that an irradiation region 34, which can be irradiated with one irradiation of the multiple beams 20, is located at the left end of the first stripe region 32 or at a position further left than the left end, and then writing is started. In the case of writing the first pass of the first stripe region 32, the writing proceeds relatively in the x direction by moving the XY stage 105 in the −x direction, for example. The XY stage 105 is moved, for example, continuously at a constant speed. After writing the first pass of the first stripe region 32, the XY stage 105 is moved in the −y direction by half (½) the distance of the width of the stripe region in order to write the second pass of the first stipe region. Specifically, the upper half of the first stripe region and the lower half of the second stripe region are written simultaneously. In that case, writing may proceed in the x direction similarly to the first pass, or may proceed in the reverse direction, namely, the −x direction. In the case of advancing the writing in the x direction again, the irradiation region 34 which can be irradiated with one irradiation of the multiple beams 20 is adjusted to be located at the left end of the second pass of the first stripe region 32 or at a position further left than the left end in a manner such that the upper half of the first stripe region and the lower half of the second stripe region are written simultaneously, and then, writing (exposing) is performed. Next, the XY stage 105 is moved in the −y direction by half (½) the distance of the width of the stripe region in order to write the whole of the second stripe region. When further writing is performed by moving the XY stage 105 in the −y direction by half (½) the distance of the width of the stripe region, the upper half of the second stripe region and the lower half of the third stripe region are written simultaneously. By repeating this, multiple writing by twice-shifting is performed. Although the lower half of the first stripe region is written only once in the above description, the writing of this portion is additionally performed separately. FIG. 4 shows the case where two passes are set, but it is not limited thereto. Writing (exposing) is repeated up to the times of set multiplicity M (the number of passes=M). The amount of shifting of each pass is not limited to 1/M of the stripe region, and it can be set arbitrarily. Then, in addition to the multiple writing described above, an additional pass writing to be described later is performed. With respect to the additional pass writing, for example, it is preferable that an additional pass writing concerning the first stripe region is carried out after the second pass of the first stripe region has been written because the amount of the stage movement is small. However, the order of writing of stripes including an additional pass can be set arbitrarily. When writing each stripe, the moving time of the XY stage 105 can be reduced by performing writing while alternately changing the direction, and thus, the writing time can also be reduced. However, the writing operation is not limited to the case of writing while alternately changing the direction, and it is also preferable to perform writing in the same direction for each stripe region 32. A plurality of shot patterns, up to as many as the number of the holes 22, are formed at a time by one shot of multiple beams having been formed by individually passing through the holes 22 in the shaping aperture array substrate 203.

Figure 5:
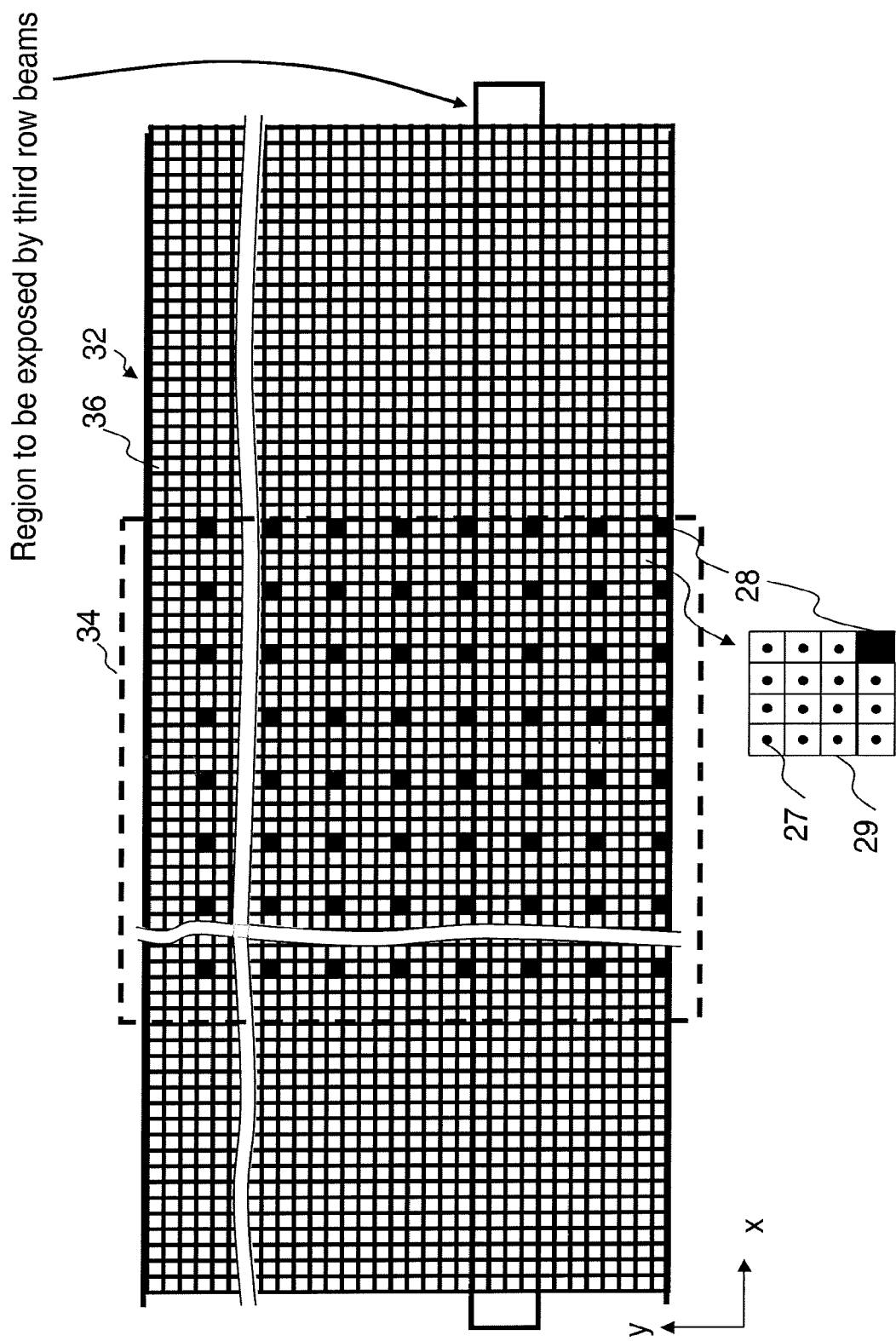
FIG. 5 shows an example of an irradiation region of multiple beams and a pixel to be written (writing target pixel) according to the first embodiment.

FIG. 5 shows an example of an irradiation region of multiple beams and a pixel to be written (writing target pixel) according to the first embodiment. In FIG. 5, in the stripe region 32, there are set a plurality of control pixels 27 (control grids) arranged in a grid form at the beam size pitch of the multiple beams 20 on the surface of the target object 101, for example. Preferably, they are arranged at an arrangement pitch of around 10 nm. A plurality of control pixels 27 serve as design irradiation positions of the multiple beams 20. The arrangement pitch of the control pixel 27 is not limited to the beam size, and may be an arbitrary size which can be controlled as a deflection position of the deflector 209 regardless of the beam size. For example, the beam size is set to be k times the arrangement pitch of the control pixels 27. However, if the beam size is smaller than the control pixel, the accuracy may be degraded, and if the beam size is extremely large compared to the control pixel size, the number of writing target pixels and the data amount may become excessive, thereby increasing the writing time. Therefore, k is preferably a real number from about 1 to about 5. For example, in response to the recent demand for accuracy, it is preferable to set about a 5 nm pixel with a 10 nm beam. A plurality of pixels 36 are set by being virtually divided into meshes each having the same size as the arrangement pitch of the control pixel 27 and centering on each control pixel 27. Hereinafter, the control pixel 27 is used meaning the central grid of the pixel 36.

Each pixel 36 serves as an irradiation unit region per beam of multiple beams. FIG. 5 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The x-direction size of the irradiation region 34 can be defined by the value obtained by multiplying the pitch between beams in the x direction of the multiple beams 20 by the number of beams in the x direction. The y-direction size of the irradiation region 34 can be defined by the value obtained by multiplying the pitch between beams in the y direction of the multiple beams 20 by the number of beams in the y direction. The width of the stripe region 32 is not limited to this. By performing writing while collectively deflecting the multiple beams 20 and shifting the position of the irradiation region 34 of the multiple beams 20 in the y direction, the stripe region 32 having a wider width can also be written. Preferably, the width of the stripe region 32 is n times (n being an integer of 1 or greater) the size of the irradiation region 34. FIG. 5 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams 20. In the example of FIG. 5, one sub-irradiation region 29 (pitch region between beams) is a square region surrounded by four adjacent pixels 28 at four corners and including one of the four pixels 28. In the case of FIG. 5, each sub-irradiation region 29 is composed of 4×4(=16) pixels.

Figure 6:
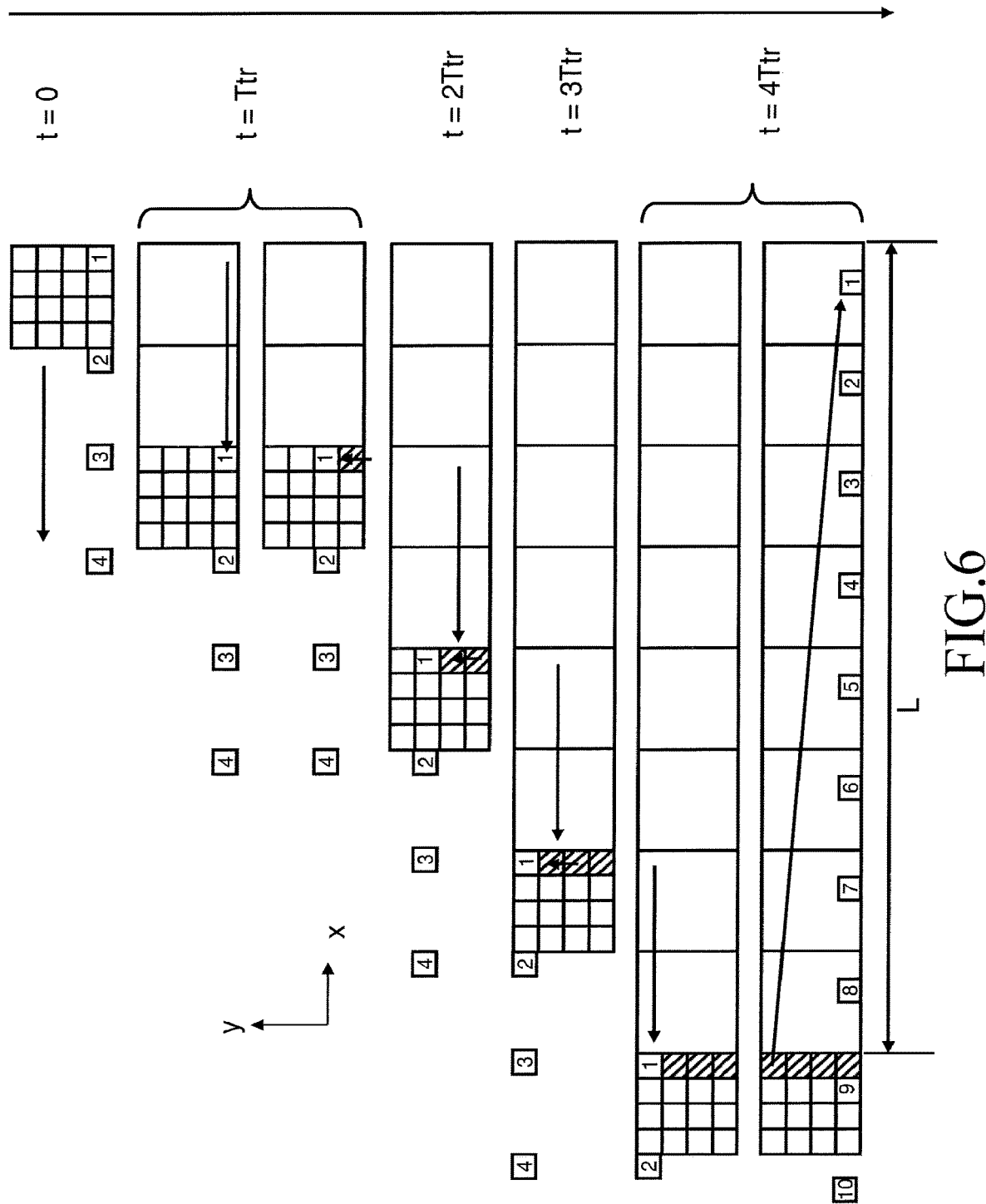
FIG. 6 illustrates an example of a writing method of multiple beams according to the first embodiment.

FIG. 6 illustrates an example of a writing method of multiple beams according to the first embodiment. FIG. 6 shows a portion of a grid to be written by each of beams at the coordinates (1, 3), (2, 3), (3, 3), . . . , (512, 3) in the third row from the bottom in the multiple beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collective deflection of all the multiple beams 20 by the deflector 208. In other words, tracking control is performed. In the case of FIG. 6, one tracking cycle is executed by writing (exposing) four pixels while moving the distance of eight beam pitches.

Specifically, the stage position detector 139 measures the position of the XY stage 105 by irradiating the mirror 210 with a laser and receiving a reflected light from the mirror

210. The measured position of the XY stage 105 is output to the control computer 110. In the control computer 110, the writing control unit 72 outputs the position information on the XY stage 105 to the deflection control circuit 130. While being in accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier unit 134. The DAC amplifier unit 134 converts the digital signal to an analog signal and amplifies it to be applied as a tracking deflection voltage to the deflector 208.

The writing mechanism 150 irradiates each pixel 36 with a corresponding one of the multiple beams 20 during a writing time corresponding to the pixel 36 concerned within a maximum irradiation time Ttr of the irradiation time of each of the multiple beams in the shot concerned.

In the example of FIG. 6, the first pixel from the right in the bottom row of the sub-irradiation region 29 concerned is irradiated with the first shot of the beam (1) at coordinates (1, 3) during the time from t=0 to t=maximum irradiation time Ttr. The XY stage 105 moves two beam pitches in the −x direction during the time from t=0 to t=Ttr, for example. During this time period, the tracking operation is continuously performed.

After the maximum irradiation time Ttr of the shot of the pass concerned has elapsed since the start of beam irradiation of the shot of the pass concerned, while the beam deflection for tracking control is continuously performed by the deflector 208, the writing position (previous writing position) of each beam is shifted to a next writing position (current writing position) of each beam by collective deflection of the multiple beams 20 by the deflector 209, which is performed in addition to the beam deflection for tracking control. In the example of FIG. 6, when the time becomes t=Ttr, the target pixel to be written is shifted from the first pixel from the right in the bottom row of the sub-irradiation region 29 concerned to the first pixel from the right in the second row from the bottom. Since the XY stage 105 is moving at a fixed speed also during this time period, the tracking operation is continuously performed.

Then, while the tracking control is continuously performed, respective corresponding ones of the multiple beams 20 are individually applied to the shifted writing positions corresponding to the respective beams during a writing time corresponding to each of the respective beams within the maximum irradiation time Ttr of the shot concerned. In the example of FIG. 6, the first pixel from the right in the second row from the bottom of the sub-irradiation region 29 concerned is irradiated with the second shot of the beam (1) at the coordinates (1, 3) during the time from t=Ttr to t=2Ttr. The XY stage 105 moves, for example, two beam pitches in the −x direction during the time from t=Ttr to t=2Ttr. During this time period, the tracking operation is continuously performed.

In the example of FIG. 6, when the time becomes t=2Ttr, the target pixel to be written is shifted from the first pixel from the right in the second row from the bottom of the sub-irradiation region 29 concerned to the first pixel from the right in the third row from the bottom by collective deflection of the multiple beams by the deflector 209. Since the XY stage 105 is moving also during this time period, the tracking operation is continuously performed. Then, the first pixel from the right in the third row from the bottom of the sub-irradiation region 29 concerned is irradiated with the third shot of the beam (1) at the coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the target pixel to be written is shifted from the first pixel from the right in the third row from the bottom of the sub-irradiation region 29 concerned to the first pixel from the right in the fourth row from the bottom by collective deflection of the multiple beams by the deflector 209. Since the XY stage 105 is moving also during this time period, the tracking operation is continuously performed. The first pixel from the right in the fourth row from the bottom of the sub-irradiation region 29 concerned is irradiated with the fourth shot of the beam (1) at the coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. In this manner, writing of the pixels in the first column from the right of the sub-irradiation region 29 concerned has been completed.

In the example of FIG. 6, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 6, when the time becomes t=4Ttr, tracking of the sub-irradiation region 29 concerned is cancelled, and the beam is swung back to a new target sub-irradiation region 29 which has been shifted by eight beam pitches in the x direction. Although the beam (1) at the coordinates (1, 3) has been described in the example of FIG. 6, writing is also similarly performed for each sub-irradiation region 29 corresponding to a beam at other coordinates. That is, when the time becomes t=4Ttr, the beam at coordinates (n, m) completes writing of pixels in the first column from the right of a corresponding sub-irradiation region 29. For example, the beam (2) at coordinates (2, 3) completes writing of pixels in the first column from the right of the sub-irradiation region 29 adjacent in the −x direction to the sub-irradiation region 29 for the beam (1) of FIG. 6.

Since writing of the pixels in the first column from the right of each sub-irradiation region 29 has been completed, in a next tracking cycle after resetting the tracking, the deflector 209 performs deflection such that the writing position of each corresponding beam is adjusted (shifted) to the second pixel from the right in the first row from the bottom of each sub-irradiation region 29.

As described above, in the state where the relative position of the irradiation region 34 to the target object 101 is controlled by the deflector 208 to be an unchanged position during the same tracking cycle, each shot of the pass concerned is carries out while performing shifting from one pixel to another pixel by the deflector 209. Then, after finishing one tracking cycle and returning the tracking position of the irradiation region 34, the first shot position is adjusted to the position shifted by one pixel, for example, and each shot is performed shifting from one pixel to another pixel by the deflector 209 while executing a next tracking control. By repeating this operation during writing the stripe region 32, the position of the irradiation region 34 is shifted consecutively, such as from 34a to 34o, to perform writing of the stripe region concerned as shown in the lower part of FIG. 4. The writing method is not limited to the example described above, and various methods can be thought. Such methods should be selected according to demand.

The first embodiment describes a correction method of suppressing generation of a defective pattern by applying a uniform dose bias to all over the writing region when a defective beam being always "on" exists in the multiple beams 20. In the Embodiments, in the case of there being not only an always-on defective beam which is uncontrollable to be off but also a dose (exposure amount) which is not required, their influences on writing can be eliminated by applying a uniform dose bias. It is here assumed that the multiple beam writing apparatus can specify a dose of each beam in multiple writing by stripe-shifting. Due to the stripe-shifting multiple writing, writing is performed shifting per stripe in order that portions each irradiated with a defective beam are not overlapped with each other, and due to the multiple writing, the dose of irradiation with a defective beam is suppressed to be smaller than the dose for pattern formation. For example, in the case of multiple writing of 4 times, the dose for writing using a defective beam is ¼ of that irradiated in normal writing. It is preferably to be ⅛ or less.

Figure 7:
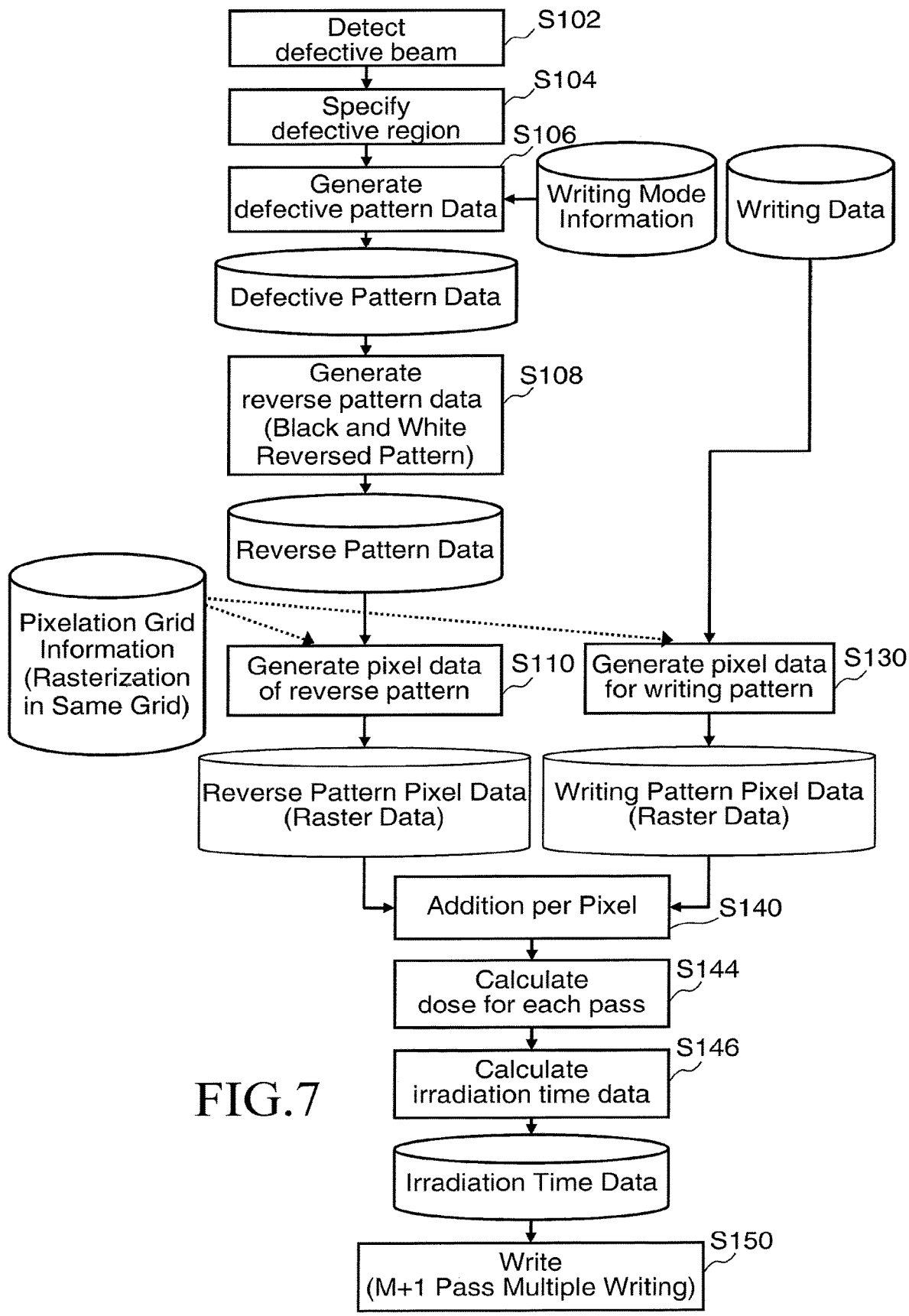
FIG. 7 is a flowchart showing main steps of a writing method according to the first embodiment.

FIG. 7 is a flowchart showing main steps of a writing method according to the first embodiment. In FIG. 7, the writing method of the first embodiment executes a series of steps: a defective beam detecting step (S102), a defective region specifying step (S104), a defective pattern data generating step (S106), a reverse pattern data generating step (S108), a reverse pattern pixel data generating step (S110), a writing pattern pixel data generating step (S130), a combining step (S140), a dose calculating step (S144) for each pass, an irradiation time data calculating step (S146), and a writing step (S150).

In writing processing, although it is ideal that irradiation of each beam is delivered at a pre-set beam pitch, the beam irradiation position of each shot is actually deviated from a desired control pixel position due to distortion caused by various factors. As the factors of distortion, there are, for example, a deflection distortion (optical distortion) resulting from lens conditions and adjustment residual of a deflection amount, and a field distortion (transfer distortion) that theoretically exists due to design precision, installation position accuracy, etc. of the optical system parts. Moreover, besides these distortions, there may exist a distortion due to other factors. Thus, the beam irradiation position is deviated by distortion resulting from these factors, and therefore, a positional deviation and a shape accuracy degradation of a desired pattern may occur. Then, first, a positional deviation amount of the irradiation position of each of the multiple beams is measured beforehand. For example, after writing a figure pattern, which is independent per beam, onto the substrate coated with resist, developing and ashing are performed. Then, the amount of positional deviation from a design position can be calculated by measuring the position of each figure pattern with a position measuring instrument. Moreover, the positional deviation amount of the irradiation position of each beam can also be calculated by scanning a mark (not shown) on the XY stage 105 with a beam. The positional deviation data is stored in the storage device 146. For example, a distortion amount map in which distortion of each position in the irradiation region 34 due to positional deviation is mapped, and this distortion amount map is stored in the storage device 146. Alternatively, it is also preferable that a positional deviation amount of each position is fitted by a polynomial in order to acquire a distortion amount arithmetic expression, and the distortion amount arithmetic expression or the coefficient of this expression is stored in the storage device 146. Although the positional deviation in the irradiation region 34 of the multiple beams 20 is here measured, it is also preferable to further consider the influence of distortion (Z correction distortion) resulting from enlargement/reduction and rotation of an image in the case of dynamically adjusting (Z position correction) the focus position of a beam by unevenness of the writing surface of the target object 101. Since which beam of the multiple-beams 20 irradiates which control pixel 27, namely, which beam passing through a correspond opening 22 irradiates which control pixel 27 is determined based on the writing sequence, the deviation amount of each control pixel is determined by the deviation amount of a corresponding beam. The writing sequence is preferably stored, as a part of writing mode information, in the storage device 144.

In the defective beam detecting step (S102), the detection unit 50 detects a defective beam in the multiple beams 20. The defective beam indicates not only an always-on beam but also a beam which may deliver a dose including an unnecessary dose to be larger than the control dose. The always-on beam always delivers irradiation of the maximum irradiation time Ttr in one shot regardless of the control dose. It further continues irradiation also during moving between pixels. According to the first embodiment, the irradiation during moving between pixels and moving between the stripe regions 32 can be stopped by collectively deflecting the multiple beams 20 with the deflector 212. In spite of performing controlling to be beam "off", if there occurs a beam leakage whose dose is smaller than that applied during the maximum irradiation time Ttr, it is also regarded as a defective beam. Specifically, under the control of the writing control unit 72, the writing mechanism 150 individually controls one of the multiple beams to be beam "on" one by one by the individual blanking mechanism 47, and all the remaining beams, except for the one "on" beam, to be beam "off". Then, the control is switched from this state to a state in which the detection target beam is made to be "off". In that case, if there is a beam whose current is detected by the Faraday cup 106 in spite of having been switched from beam "on" to beam "off", it is detected as a defective beam. For example, an unnecessary dose can be calculated depending on a beam current amount detected during the period from switching to beam "off" to completion of the maximum irradiation time Ttr in one shot, or depending on a detection time. By checking each of the multiple beams 20 in order by the same method, it is possible to detect whether there is a defective beam or not, where a defective beam is located, and how much the unnecessary dose each defective beam has. Moreover, a similar evaluation can be executed by applying a beam irradiation onto the substrate coated with resist and evaluating the irradiated dose.

In the defective region specifying step (S104), the specifying unit 51 (defective region specifying unit) specifies a defective region to be irradiated with a defective beam which may deliver a dose being larger than the control dose and including an unnecessary dose, in the writing region 30 of the target object 101. Since the control pixel 27 to be irradiated with a defective beam is determined based on the writing sequence, the specifying unit 51 obtains the coordinates of the control pixel 27 to be irradiated with the defective beam from the writing sequence defined in writing mode information stored in the storage device 144. Moreover, since there is probability that the irradiation position of a defective beam is deviated from the control pixel 27, the actual irradiation position (coordinates) is acquired from the positional deviation data stored in the storage device 146.

Then, the specifying unit 51 calculates the pattern size (irradiation shape) of a pattern (defective pattern) to be formed when this irradiation position is irradiated with an unnecessary dose of the defective beam. For example, the irradiation shape by a defective beam can be known (obtained) based on a relationship between the dose and the irradiation shape, obtained by previously making the dose variable, and measuring each pattern size to be formed when irradiated with a beam of a size φ using the variable dose, by experiment or simulation. By these, the specifying unit 51 specifies the defective region for each defective beam, based on an irradiation position and a pattern size to be formed. Since the position and size of a defective region are the position and region size of a pattern actually formed or to be probably formed, they can be calculated independently from the position and pixel size of the control pixel 27.

Figure 8:
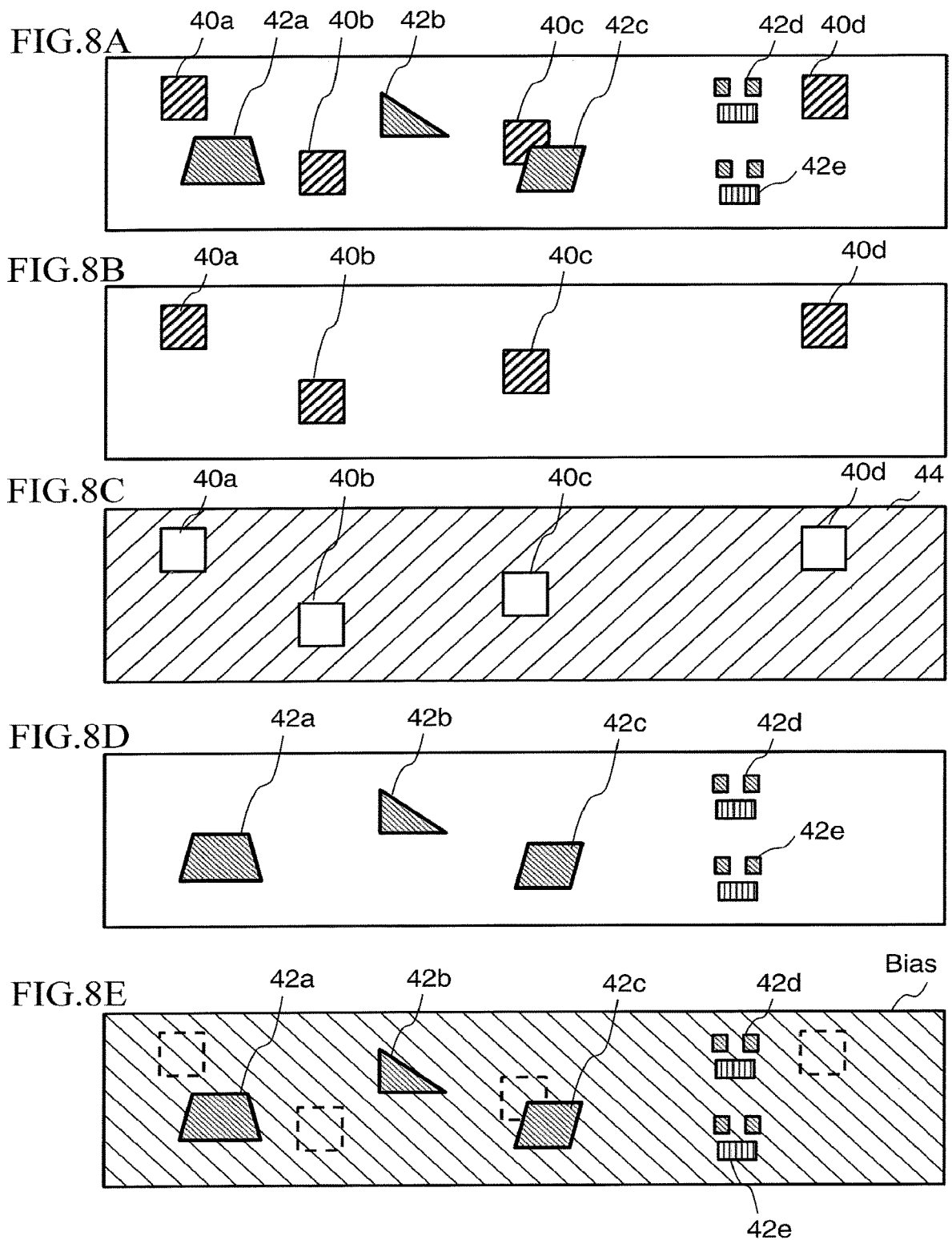
FIGS. 8A to 8E show examples of patterns at each stage in a writing method according to the first embodiment.

FIGS. 8A to 8E show examples of patterns at each stage in a writing method according to the first embodiment. FIG. 8A shows an example of a writing target pattern defined in writing data and a defective pattern formed by a defective beam. Specifically, FIG. 8A shows figure patterns 42a to 42e being writing target patterns defined in writing data, and defective patterns 40a to 40d each being a defective region formed by a defective beam. If these patterns are written as they are, the dimension of the figure pattern 42c overlapping with the defective pattern 40c deviates particularly. For example, in the case of multiple writing of 4 times, although the dose for a defective pattern is 25% of that for a figure pattern, since 25% is added to the normal dose at the portion where the figure pattern overlaps with the defective pattern, it turns to be deviation of the pattern formation position.

In the defective pattern data generating step (S106), the defective pattern data generation unit 52 generates defective pattern data of a defective pattern having the shape of a defective region in the writing region (e.g., stripe region 32). As shown in FIG. 8B, only the defective patterns 40a to 40d are extracted to define defective pattern data. In the defective pattern data, for example, the figure type, coordinates, and pattern size are defined. Furthermore, an unnecessary dose or an identifier indicating the unnecessary dose is defined as additional data. Preferably, the unnecessary dose is defined by a relative value, ratio, or percentage standardized based on the criterion that the reference (or base) dose is regarded as 100 (alternatively, 1 or 10). With respect to the always-on beam, its unnecessary dose is equivalent to the beam dose applied during the maximum irradiation time Ttr of one shot. Since multiple writing is performed in the first embodiment, the beam dose applied during the maximum irradiation time Ttr of one shot is smaller than the reference dose being a criterion for the total dose after the multiple writing. For example, it is 25% of the reference dose in the case of multiple writing of 4 times.

Alternatively, treating the beam dose applied during the maximum irradiation time Ttr of one shot as a reference unnecessary dose, the unnecessary dose may be preferably defined by a relative value, ratio, or percentage standardized based on the criterion that the reference unnecessary dose is regarded as 100 (alternatively, 1 or 10).

In the examples of FIGS. 8A to 8E, each of the defective patterns 40a to 40d is formed by an always-on beam, for example. Alternatively, they may be formed by defective beams each having the same unnecessary dose. When, for example, each of the defective patterns 40a to 40d is formed by an always-on beam, since each unnecessary dose has the same value, it is acceptable to omit the unnecessary dose from defective pattern data.

Thus, when performing writing in a specified writing mode, the portion to be written by a defective beam is estimated to generate corresponding writing data (defective pattern: unnecessary exposure pattern). The multiple writing is based on stripe-shifting multiple and M+1 pass writing corresponding to a defective beam. The defective beam writing pattern (defective pattern: unnecessary exposure pattern) is determined by a writing mode (writing sequence) regardless of a writing pattern. In other words, the writing mode determines the beam irradiation position, and the specified dose determines the maximum irradiation time Ttr of each pass in multiple writing, which results in determining the irradiation time (dose) of the portion irradiated with a defective beam. To make it simple, it is also acceptable to use writing data in which a beam size figure is arranged at the portion irradiated with a defective beam. The degree of detailed shape representation may be determined depending upon required accuracy.

In the reverse pattern data generating step (S108), the reversing unit 53 (reverse pattern data generation unit) generates reverse pattern data (reversed pattern data) by reversing defective pattern. As shown in FIG. 8C, a reverse pattern (reversed pattern) 44 is generated by reversing black and white of the defective pattern. Therefore, in the example of FIG. 8C, the positions of the defective patterns 40a to 40d are treated as no figure pattern, and the circumference around them is treated as a figure pattern. Furthermore, a reversed unnecessary dose obtained by reversing an unnecessary dose, or an identifier indicating the reversed unnecessary dose is defined as additional data. When each of the defective patterns 40a to 40d is formed by an always-on beam, for example, the dose at the position of each of them is zero, and the dose in the other region is the beam dose applied during the maximum irradiation time Ttr of one shot, such as 25% in the case of multiple writing of 4 times, for example. Therefore, preferably, the reversed unnecessary dose at the position of each of the defective patterns 40a to 40d is defined as a value "0" or 0%, and the reversed dose in the other region is defined as a value "25", 0.25, or 25%. Alternatively, when each of the defective patterns 40a to 40d is formed by an always-on beam, for example, since it has been turned out that the reversed unnecessary dose at the portion without a pattern is 0%, and the reversed unnecessary dose at the portion with a pattern is 25%, it is acceptable to omit the reversed unnecessary dose from the reverse pattern data.

Alternatively, when the unnecessary dose defined in defective pattern data is defined by a standardized relative value, ratio, or percentage based on the criterion that the reference unnecessary dose being the beam dose applied during the maximum irradiation time Ttr of one shot is regarded as 100 (alternatively, 1 or 10), the dose at the position of each of the defective patterns 40a to 40d is "0", and the dose in the other region is 100%. Therefore, it is preferable that the reversed unnecessary dose at the position of each of the defective patterns 40a to 40d is defined as a value "0" or 0%, and the reversed dose in the other region is defined as a value "100", 10 or 100%.

As described above, there is generated the reverse pattern (black and white reverse pattern) of the portion (defective pattern: unnecessary exposure pattern) written by a defective beam. By generating the black and white reverse pattern, writing data (writing data for additionally irradiating a portion not irradiated with an always-on defective beam) for performing correction for equalizing bias is generated. Then, the reverse pattern is pixelated so as to generate raster data composed of a series of pixel data. According to the first embodiment, defective pattern data and reverse pattern data are generated in the form of figure data before generating reverse pattern raster data. Thereby, the same processing system as that of normal writing can be used.

In the reverse pattern pixel data generating step (S110), the rasterization unit 54 (reverse pattern data conversion unit) converts reverse pattern data into reverse pattern pixel data (reversed pattern pixel data) which defines the value corresponding to the dose for each control pixel 27 (pixel). First, the writing control unit 72 inputs writing mode information from the storage device 144, and associates, for each stripe region 32, each control pixel 27 in the stripe region 32 concerned with the beam in associated with the control pixel 27 concerned, based on a writing sequence. Then, the writing control unit 72 inputs pixelation grid information generated beforehand from the storage device 146, and associates each control pixel 27 with the position of the pixelation grid. First, the pixelation grid information is described below.

Figure 9:
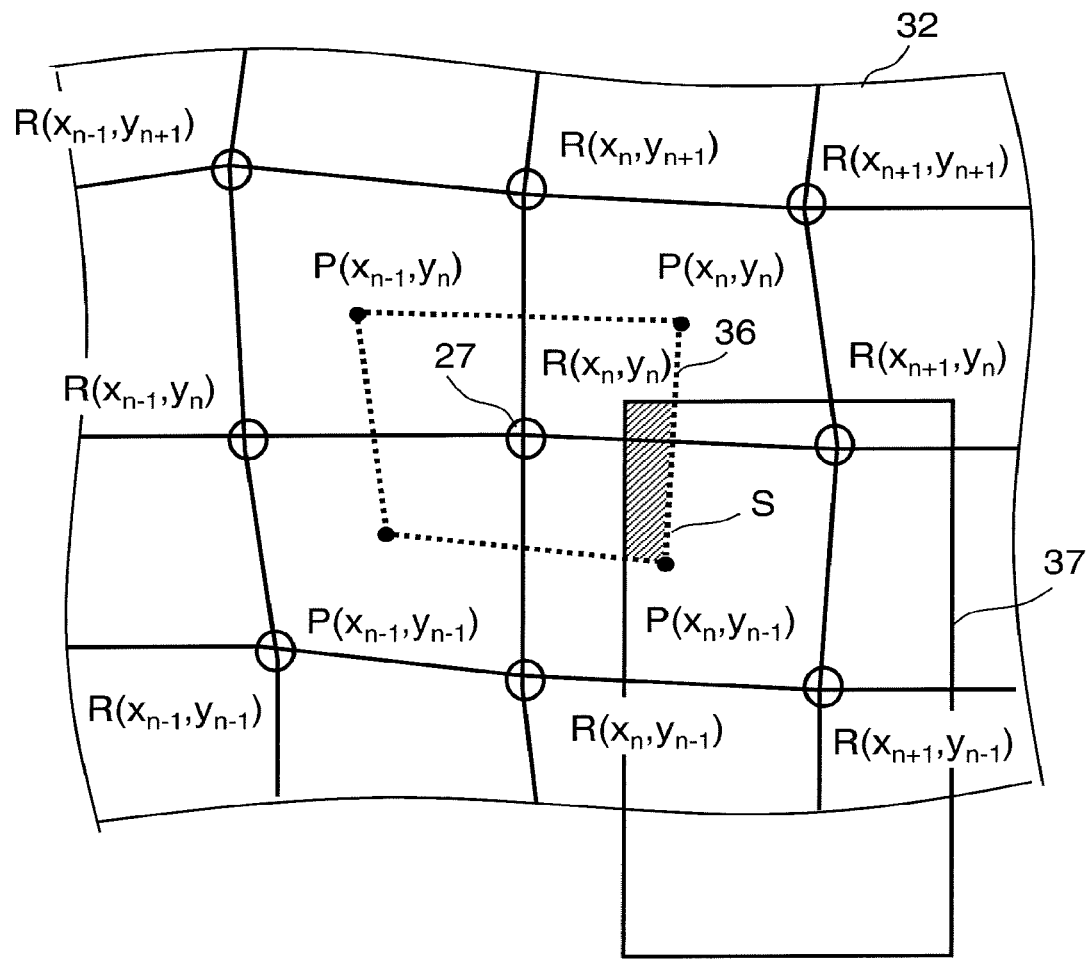
FIG. 9 illustrates a shift of a control pixel and the region of the pixel after the shift according to the first embodiment.

FIG. 9 illustrates a shift of a control pixel and the region of the pixel after the shift according to the first embodiment. In FIG. 9, the pixel region correction unit 64 inputs positional deviation data of each beam, and shifts, for each stripe region 32, the position of each control pixel 27 (R) in the stripe region 32 concerned to the irradiation position of the beam associated after positional deviation, based on the positional deviation data. Then, the pixel region correction unit 64 variably sets the dose depending upon the positional deviation amount, and makes the resolution position of the pattern coincide with the original design position. In the example of FIG. 9, the region associated with each control pixel is transformed dependent on the deviation amount of the irradiation position of each beam. Thereby, the resolution position of a pattern matches the original design position by varying the dose sharing ratio between adjacent control pixels. With respect to a beam having no positional deviation, it is unnecessary to perform correction by shifting the control pixel 27 concerned. In the case where the irradiation position of each beam is not deviated from the design position, or where it is assumed there is no deviation, each control pixel 27 (R) is an intersection of orthogonal grids composed of a plurality of orthogonal lines in two directions, and each pixel 36 is a rectangular region which is obtained by virtually dividing into meshes by the size equal to the arrangement pitch of the control pixel 27, and which centers on the corresponding control pixel 27. Thus, pixelation of a figure is performed based on pixelation grid (uniform grid) being uniform in the x and y directions. However, in the case of there being beam positional deviation, as shown in FIG. 9, distortion occurs in the shape of the grid of each control pixel 27 (R). Then, the pixel region correction unit 64 changes the region of the pixel 36, depending upon the shift of the control pixel 27, in order to perform correction. In that case, the center P of the region surrounded by close 2×2 control pixels Rs arranged in length and width is calculated. The region surrounded by four region centers Ps centering on the control pixel 27 is defined as the pixel 36 of the control pixel 27 concerned. In FIG. 9, with respect to the first quadrant of the region centering on the control pixel R($x_n$, $y_n$) of the coordinates ($x_n$, $y_n$), it is possible to obtain the center P ($x_n$, $y_n$) of the region surrounded by the control pixel R($x_n$, $y_n$) the control pixel R($x_{n+1}$, $y_n$), the control pixel R($x_{n+1}$, $y_{n+1}$), and the control pixel R($x_n$, $y_{n+1}$). Similarly, with respect to the second quadrant of the region centering on the control pixel R($x_n$, $y_n$), it is possible to obtain the center P($x_{n-1}$, $y_n$) of the region surrounded by the control pixel R($x_n$, $y_n$), the control pixel R($x_{n-1}$, $y_n$), the control pixel R($x_{n-1}$, $y_{n+1}$), and the control pixel R($x_n$, $y_{n+1}$). Similarly, with respect to the third quadrant of the region centering on the control pixel R($x_n$, $y_n$), it is possible to obtain the center P($x_{n-1}$, $y_{n-1}$) of the region surrounded by the control pixel R($x_n$, $y_n$) the control pixel R($x_{n-1}$, $y_n$), the control pixel R $y_{n-1}$), and the control pixel R($x_n$, $y_{n-1}$). Similarly, with respect to the fourth quadrant of the region centering on the control pixel R($x_n$, $y_n$), it is possible to obtain the center P ($x_n$, $y_{n-1}$) of the region surrounded by the control pixel R($x_n$, $y_n$), the control pixel R($x_{n+1}$, $y_n$), the control pixel R($x_{n+1}$, $y_{n-1}$) and the control pixel R($x_n$, $y_{n-1}$). Therefore, the pixel 36 of the control pixel R($x_n$ $y_n$) is the region surrounded by the region centers P ($x_n$, $y_n$), P($x_{n-1}$, $y_n$), P($x_{n-1}$, $y_{n-1}$) and P($x_n$, $y_{n-1}$). Thus, the pixel 36 is corrected from the rectangular shape to the deviated shape. By the procedure described above, the pixel region correction unit 64 generates pixelation grid information in which the position of each control pixel 27 and the region of each pixel 36 have been corrected. The grid formed by the boundaries of the pixel 36 is a pixelation grid, and, in the case of FIG. 9, is a non-uniform pixelation grid (non-uniform grid) being non-uniform in the x and y directions. By the writing method according to the first embodiment, it is possible to execute writing correcting deviation of the irradiation position of each beam by performing pixelation (rasterization) using pixelation grids in which the position of each control pixel 27 and the region of each pixel 36 have been corrected. The generated pixelation grid information is stored in the storage device 146.

The rasterization unit 54 (reverse pattern data conversion unit) calculates, for each control pixel 27, the area density $\rho''$ of a reverse pattern defined in reverse pattern data of the pixel 36 of the control pixel 27 concerned, using the position of each control pixel 27 and the region of each pixel 36 defined in pixelation grid information. In the case of FIG. 9, an area density S of a figure pattern 37 arranged in the pixel 36 of the control pixel R($x_n$, $y_n$) is calculated. That is, the overlapped area (relative value) between the region of the pixel 36 and the figure pattern 37 is the area density S. Dimension deviation and the like of a written pattern occurring along with positional deviation of a beam irradiation position can be corrected by correcting the position of each control pixel 27 and the region of each pixel 36. With respect to the case of FIG. 9, which is an example of a non-uniform pixelation grid (non-uniform grid) being non-uniform in the x and y directions, since each pixel 36 is connected having no space, the gross area of a certain region in which the pixels with the non-uniform grid are connected is the same as that in the case of the certain region in which the pixels with a pixelation grid (uniform grid) being uniform in the x and y directions are connected. Although the entire doses for the regions are the same in both the cases, if using the non-uniform pixelation grid, it becomes possible to correct the dose deviation occurring along with the positional deviation of a beam irradiation position, thereby correcting pattern dimension errors and the like. Here, although, in reverse pattern data, the portion of writing region for performing correction to equalize bias aims to keep a constant (fixed) bias, the area density $\rho''$ of a reverse pattern is not constant (fixed) in the non-uniform pixelation grid in the case of FIG. 9 since the region area of each pixel in the non-uniform pixelation grid is different from each other. This is because to keep a uniform dose by performing correction, even if there is positional deviation in the beam irradiation position. The pixelation grid information is not limited to this example, it may be determined depending on required accuracy.

The rasterization unit 54 calculates, for each control pixel 27, a standardized dose (value corresponding to dose) by multiplying the calculated area density ρ" of the reverse pattern by a reversed unnecessary dose of the reverse pattern concerned. In that case, if there are a plurality of reverse pattern figures related to the pixel 36 concerned, the rasterization unit 54 calculates a standardized dose of the control pixel 27 by calculating the area density ρ" for each reverse pattern figure, calculating a standardized dose (value corresponding to dose) by multiplying the area density ρ" of each reverse pattern figure by a reversed unnecessary dose of the reverse pattern figure concerned, and adding standardized doses of a plurality of related reverse pattern figures. Preferably, the pattern area density ρ" is calculated as a relative value (e.g., 100%) on the basis of the pixel region area of a uniform pixelation grid (uniform grid) which has no deviation and is uniform in the x and y directions. The standardized dose (dose coefficient) is indicated by a relative value, ratio, or percentage value standardized based on the criterion that the reference dose is regarded as 100 (alternatively, 1 or 10). Then, the rasterization unit 54 generates reverse pattern pixel data which defines the dose standardized for each control pixel 27. Alternatively, the dose D(x) may be calculated as an incident dose itself which is obtained by multiplying the reference dose, the area density ρ" of the reverse pattern, and the reversed unnecessary dose of the reverse pattern concerned. The reverse pattern pixel data serves as raster data of a reverse pattern.

Alternatively, when the reversed unnecessary dose defined in reverse pattern data is defined by a standardized relative value, ratio, or percentage based on the criterion that the reference unnecessary dose being the beam dose applied during the maximum irradiation time Ttr of one shot is regarded as 100 (alternatively, 1 or 10), the rasterization unit 54 calculates, for each control pixel 27, a standardized dose (value corresponding to dose) by multiplying the calculated area density ρ" of the reverse pattern, the reversed unnecessary dose of the reverse pattern concerned, and the ratio, which is obtained by dividing the reference unnecessary dose by the reference dose. Thus, by performing multiplication using the ratio obtained by dividing the reference unnecessary dose by the reference dose, it is possible to match the standardized dose with the ratio of the case where the reference dose is regarded as 100 (alternatively, 1 or 10). Alternatively, the dose D(x) may be calculated as an incident dose itself which is obtained by multiplying the reference unnecessary dose, the area density ρ" of the reverse pattern, and the reversed unnecessary dose of the reverse pattern concerned.

The dose at the position of each of the defective patterns 40a to 40d is "0", and the dose in the other region is about 25%, which changes depending on the contents of pixelation grid information, in the case of the multiple writing of 4 times. Therefore, it is preferable that the reversed unnecessary dose at the position of each of the defective patterns 40a to 40d is defined as a value "0" or 0%, and the reversed dose in the other region is defined as a value "25", 0.25 or 25%.

In the writing pattern pixel data generating step (S130), the rasterization unit 55 (writing pattern data conversion unit) converts writing pattern data which defines a figure pattern to be written into writing pattern pixel data which defines a value corresponding to the dose for each control pixel 27. FIG. 8D shows figure patterns 42a to 42e used as writing patterns based on writing data. Here, pixel data is generated so that the figure patterns 42a to 42e defined in the writing data may be arranged, excluding the defective patterns 40a to 40d.

First, the area density calculation unit 56 (p calculation unit) virtually divides the writing region (here, for example, stripe region 32) into a plurality of proximity mesh regions (mesh regions for proximity effect correction calculation) by a predetermined size. The size of the proximity mesh region is preferably set to be about 1/10 to 1/30 of the influence range of the proximity effect, such as about 1 μm. The p calculation unit 56 reads writing data from the storage device 140, and calculates, for each proximity mesh region, a pattern area density p of a pattern arranged in the proximity mesh region concerned.

Next, the corrected irradiation coefficient calculation unit 57 ($D_p$ calculation unit) calculates, for each proximity mesh region, a proximity-effect corrected irradiation coefficient $D_p$ (x) (correction dose) for correcting a proximity effect. The proximity-effect corrected irradiation coefficient $D_p$ (x) can be defined by a threshold value model where a backscatter coefficient η, a dose threshold value Dth of the threshold value model, and a distribution function $g_p$ (x) are used. The calculation method may be the same as the one used in a conventional method. Preferably, the proximity-effect corrected irradiation coefficient $D_p$ (x) is optimized in accordance with the conditions of an assumed dose for bias.

Next, the area density calculation unit 58 (ρ' calculation unit) calculates, for each control pixel 27, a pattern area density ρ' of the pixel 36 of the control pixel 27 concerned. In that case, the area density calculation unit 58 calculates, for each control pixel 27, the pattern area density ρ' of a writing pattern defined in writing data of the pixel 36 of the control pixel 27 concerned, using the position of each control pixel 27 and the region of each pixel 36 defined in pixelation grid information stored in the storage device 146. By using the same pixelation grid information as that having been used for generating raster data of a reverse pattern, it is possible to generate raster data such that no positional deviation occurs in the irradiation shape of the writing pattern and the reverse pattern. Similarly to the case of FIG. 9, an area density S of the figure pattern 37 arranged in the pixel 36 of the control pixel $R(x_n, y_n)$ is calculated to be regarded as a pattern area density ρ'. In that case, if there are a plurality of figures related to the pixel 36 concerned, the area density calculation unit 58 calculates the pattern area density ρ' for each figure, and adds all of them to obtain the pattern area density ρ' of the pixel 36 concerned. Preferably, the pattern area density ρ' is calculated as a relative value (e.g., 100%) on the basis of the pixel region area of a uniform pixelation grid (uniform grid) which has no deviation and is uniform in the x and y directions. In the case of using a non-uniform grid, since the pixel region may be larger than that of the case using a uniform grid, the pattern area density ρ' obtained after the calculation may exceed 100%. Thus, dimension deviation and the like of a pattern to be written occurring along with the positional deviation of the beam irradiation position can be corrected by obtaining the pattern area density ρ' by correcting the region of each pixel 36 based on the shift position of each control pixel 27.

Next, the dose calculation unit 59 (D calculation unit) calculates, for each control pixel 27, a dose D(x) for irradiating the pixel 36 of the control pixel 27 concerned. The dose D(x) is calculated by multiplying the proximity-effect corrected irradiation coefficient $D_p$ by the pattern area density ρ'. In that case, the dose D(x) is indicated by a relative value, ratio, or percentage value standardized based on the criterion that the reference dose is regarded as 100 (alternatively, 1 or 10). The dose calculation unit 59 generates writing pattern pixel data which defines the dose (value corresponding to dose) standardized for each control pixel 27. Alternatively, the dose D(x) may be calculated as an incident dose itself which is obtained by multiplying the reference dose, the proximity-effect corrected irradiation coefficient $D_p$, and the pattern area density ρ'. The writing pattern pixel data serves as raster data of a writing pattern.

In the combining step (S140), the combining unit 60 (combined-value pixel data generation unit) generates, for each control pixel 27, combined-value pixel data by adding values defined in the reverse pattern pixel data and the writing pattern pixel data. Specifically, the combining unit 60 adds standardized doses (values corresponding to doses) defined in the reverse pattern pixel data and the writing pattern pixel data. Since the standardized dose defined in the reverse pattern pixel data has been standardized based on the criterion that the reference dose is regarded as 100 (alternatively, 1 or 10), it can be added as it is. Alternatively, incident doses defined in the reverse pattern pixel data and the writing pattern pixel data are added together.

By irradiating each control pixel 27 with the beam dose based on the combined-value pixel data, as shown in FIG. 8E, an unnecessary dose enters each of the defective patterns 40a to 40d, and a reversed dose enters the portion other than the defective patterns 40a to 40d. Therefore, the whole of the writing region (in this case, the stripe region 32) is biased by the unnecessary dose. Thus, the base of the dose for bias can be formed as if the defective patterns 40a to 40d themselves do not exist. Therefore, the writing result not affected by the irradiation shape of the defective beam can be obtained.

Figure 10:
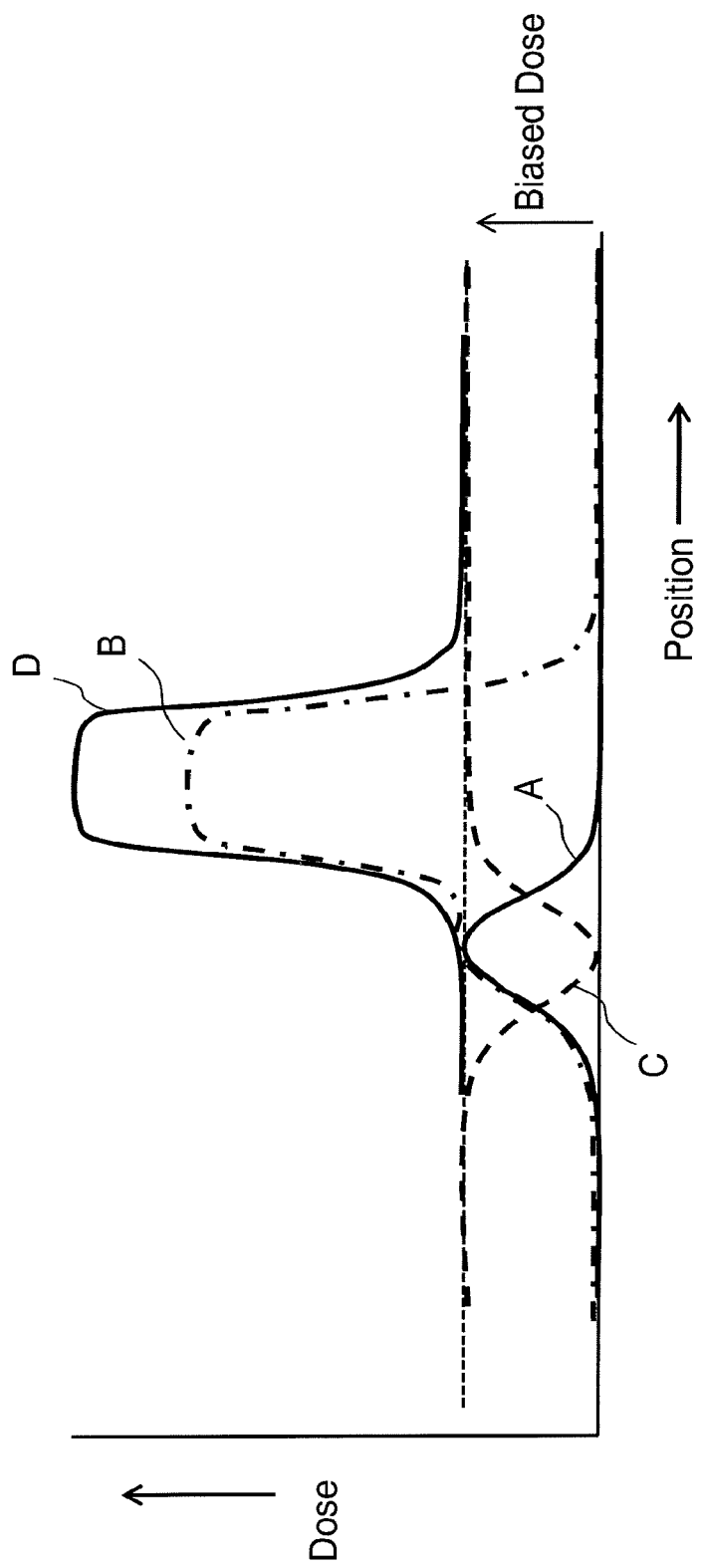
FIG. 10 shows an example of a dose distribution according to the first embodiment.

FIG. 10 shows an example of a dose distribution according to the first embodiment. In the case of FIG. 10, a dose distribution (dose profile) in one-dimensional direction is shown. The dose distribution A represents distribution of an unnecessary dose of a defective beam. If a writing pattern is formed in this state, the dose at the position where an unnecessary dose enters is enlarged as shown in the dose distribution B. Accordingly, the resolution position of the left side pattern is deviated. Then, according to the first embodiment, by performing pattern writing in the state being offset by the dose for bias since the dose distribution C reversed from the dose distribution A is added, the distortion of the dose distribution can be corrected as shown in the dose distribution D, thereby writing a desired size pattern. Although, in that case, it is assumed that the pattern resolution dimension may deviate because the dose for bias is added, adjustment of suitable process conditions should be performed in advance depending on the dose for bias. According to this method, the influence of the unnecessary dose can be corrected exactly by setting the reversed dose distribution C with great accuracy, thereby correcting deviation of the pattern resolution position precisely.

In the dose calculating step (S144) for each pass, the pass data generation unit 62 divides the dose defined in the combined-value pixel data into doses of the passes of multiple writing of M+1 times. When multiple writing of M times is designed, in the control pixel 27 irradiated with a defective beam, one of M passes is irradiated with the defective beam. However, for maintaining the pattern dimension accuracy by performing multiple writing while shifting the position, it is desirable to carry out original-number-pass multiple writing. Therefore, by adding one more additional pass to the multiple writing of M times, passes of the original number M can be written with normal beams, in addition to the pass irradiated with a defective beam. Thus, in the control pixel 27 irradiated with a defective beam, the dose defined in the combined-value pixel data is divided into M passes being passes other than the pass irradiated with the defective beam. The dose of the pass irradiated with a defective beam is set to zero on the data. In the control pixel 27 not irradiated with a defective beam, the dose defined in the combined-value pixel data is divided into M+1 passes. The method of division may be uniform dose dividing, or different dose dividing depending on the pass.

In M+1 pass multiple writing, a writing pattern is written in M passes somewhere in M+1 passes. Since irradiation of an always-on defective beam is performed for executing writing in M+1 passes, when forming a bias equalized pattern, it is on the basis that there are M+1 passes. When executing writing, in general, the shot cycle is simply set to the maximum irradiation time, but the shot cycle according to the first embodiment is set to a time with enough time margin with respect to the reference dose (reference dose/M) of each pass since various corrections may be performed. The dose used here for pattern writing of each pass is a dose applied during the time equivalent to reference dose/M (reference dose divided by M) in the maximum irradiation time. Moreover, here, the irradiation position of an always-on defective beam is supposed to be not overlapped with each other because of shift writing, and the dose to the irradiation position is a dose applied during the maximum irradiation time. This dose serves as a dose for bias to be equalized. Here, it is assumed that the period (settling period) for shifting to the irradiation time of the next shot cycle is thoroughly small, or all the beams are made off by the deflector 212. If the period cannot be ignored, a defective pattern (unnecessary exposure pattern) may be formed by simulating the action of the always-on defective beam in the settling period. In the assumed basic writing mode here, it is supposed that a particular portion is irradiated with the dose of a one-shot cycle by one pass. The present method can also be executed in the writing mode in which a particular portion is irradiated with doses of a plurality of shot cycles by one pass.

<Regarding Setting Maximum Irradiation Time of Each Pass>

Here, the dose for writing needs to be the total of the reference dose and the dose for bias. If the dose being the amount of bias is distributed to M passes in M+1 passes similarly to the normal writing pattern, the dose of each pass can be obtained by (reference dose)/M+bias/M=(reference dose)/M+(maximum dose of one pass)/M.

Since the dose of a defective beam is applied as the maximum dose, and the dose being the bias amount for each pass is (maximum dose of one pass)/M, it is necessary that the shot cycle (maximum irradiation time) of each pass is based on that (maximum dose of one pass)>(reference dose)/M+(maximum dose of one pass)/M.

When rewriting the above expression, (maximum dose of one pass)·(M−1)/M>(reference dose)/M and (maximum dose of one pass)>[(reference dose)/M]·[M/(M−1)].

That is, in the case of eight passes, the maximum irradiation time should be set to be 8/7=1.14 times or greater of that of normal writing. However, actually, the setting is preferably performed with time margin for adjustment in correction such as correcting beam intensity of an individual beam, increasing/decreasing the dose due to proximity effect correction. Thus, the maximum dose (maximum irradiation time) per pass is determined to execute bias writing. The original shot cycle (maximum irradiation time) may be set, as a writing condition, with spare time for a dose added due to such as correction (proximity effect correction and the like) of the dose.

In the irradiation time data calculating step (S146), the irradiation time calculation unit 68 calculates the irradiation time of a beam that irradiates each control pixel 27 in each pass. The irradiation time t of a beam for each pass can be calculated by dividing the dose of the beam irradiating each control pixel 27 in each pass by the current density J. The current density J can be calculated by dividing a beam current value by a specified beam size. When the dose of the beam that irradiates each control pixel 27 in each pass is defined by the standardized dose based on the criterion that the reference dose is regarded as 1, the irradiation time t of a beam for each pass can be calculated by multiplying the standardized dose by the reference dose, and dividing the multiplied value by the current density J. Alternatively, the irradiation time t of a beam for each pass can be calculated by multiplying the value which is obtained by dividing the reference dose by the current density J, by the standardized dose.

Data of the irradiation time t of a beam irradiating each control pixel 27 in each pass is rearranged in order of pass and shot by the arrangement processing unit 70. The irradiation time data (shot data) of each control pixel 27 rearranged in order of pass and shot is temporarily stored in the storage device 142.

In the writing step (S150), the writing mechanism 150 performs multiple writing, using the electron multiple beams 20, on the target object 101 such that each control pixel 27 is irradiated with the beam dose corresponding to the value defined in combined-value pixel data.

Figure 11:
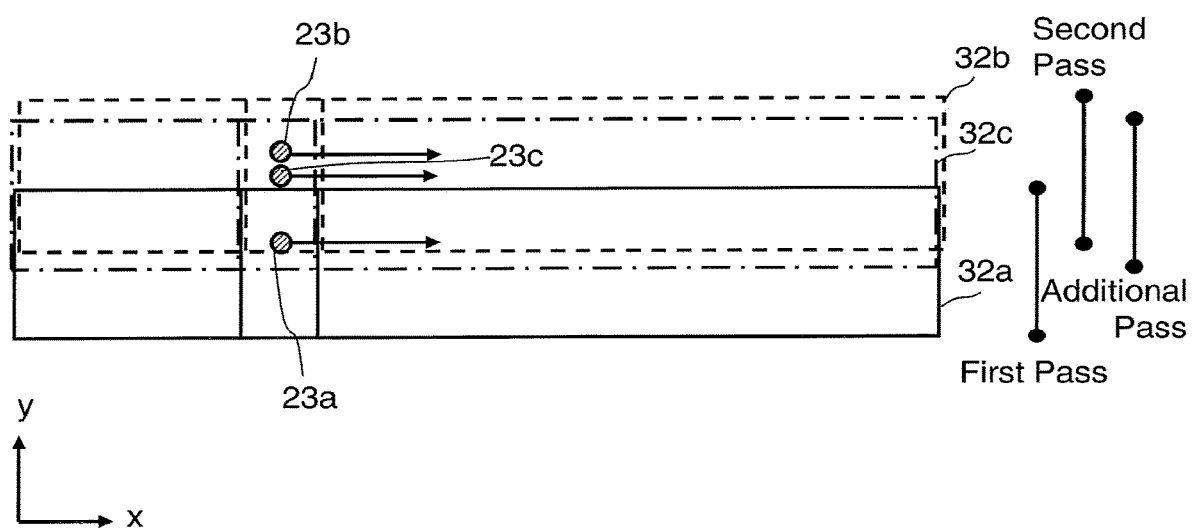
FIG. 11 illustrates a method of multiple writing according to the first embodiment.

FIG. 11 illustrates a method of multiple writing according to the first embodiment. In the first embodiment, writing is performed for each pass of multiple writing of M+1 times while shifting the position. FIG. 11 shows the case of multiple writing of 3 (=M+1) times composed of two passes (M=2 on design) and one additional pass. A stripe region 32a is written through the writing processing for the first pass. In the first pass, an irradiation position 23a is irradiated with an unnecessary dose of a defective beam. In the second pass, a stripe region 32b which is shifted in the y direction by ½ the width of the stripe region from the first pass writing processing is written, where an irradiation position 23b, being different from the irradiation position of the first pass, is irradiated with an unnecessary dose of a defective beam. A stripe region 32c, which is shifted in the y (and −y) direction by the size smaller than the width of the stripe region from the first and second pass writing processing, is written in the additional pass (third pass). By shifting the position depending on the pass, it is possible to change the position of the control pixel 27 to be irradiated with a defective beam. In other words, it is possible to avoid to write the same control pixel 27 with the defective beam a plurality of times. When a plurality of defective beams are generated in the multiple beams 20, the way of shifting the position of the target stripe region of each pass should be adjusted so that the same control pixel 27 may not be irradiated with a plurality of defective beams.

In the cases of FIGS. 8A to 8E described above, each of the defective patterns 40a to 40d is formed by an always-on beam, for example. Alternatively, all of them are formed by defective beams having the same unnecessary dose. However, it is not limited thereto. The intensity of the unnecessary dose might be different depending on the defective beam. For example, the intensity of the unnecessary dose of an always-on beam differs from that of the beam which leaks due to defection of blanking performance. Moreover, for example, the intensities of unnecessary doses of beams having settling defection might be different from each other. Even with respect to always-on beam, since the current density of each beam is not uniform in the multiple beams 20, or the size of the hole 22 for beam formation is not uniform, intensities of unnecessary doses applied during the maximum irradiation time Ttr might be different from each other. Regarding a normal beam, it is possible to previously measure the dose applied during the maximum irradiation time Ttr, and to correct the dose, by irradiation time control, to be a desired one at the time of beam irradiation. However, regarding an always-on beam, it is difficult to perform such correction. The first embodiment can also be applied to a plurality of defective patterns of different unnecessary doses. In that case, in the defective pattern data generating step (S106), the defective pattern data generation unit 52 generates defective pattern data in which a plurality of defective patterns having different unnecessary doses are defined, and further a value corresponding to the unnecessary dose related to each defective pattern is defined.

As described above, when performing writing, the dose of the amount of a reverse pattern is added to normal writing data (raster data), for each pixel. Writing is carried out in the mode which uses only a normal beam. Thereby, the dose control can be secured. Not to limited to the two pass multiple writing described above, it is preferable to use four passes or more in order that portions of a defective beam may not overlap with each other. Thereby, the bias amount can be suppressed low. As described above, preferably, dose addition by the reverse pattern is divided and distributed to each pass.

Figure 12A:
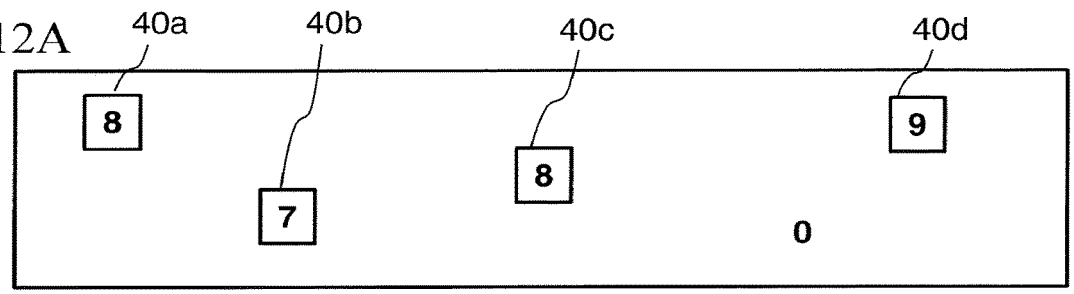
FIGS. 12A to 12C show other examples of patterns each at each stage in a writing method according to the first embodiment.
Figure 12B:
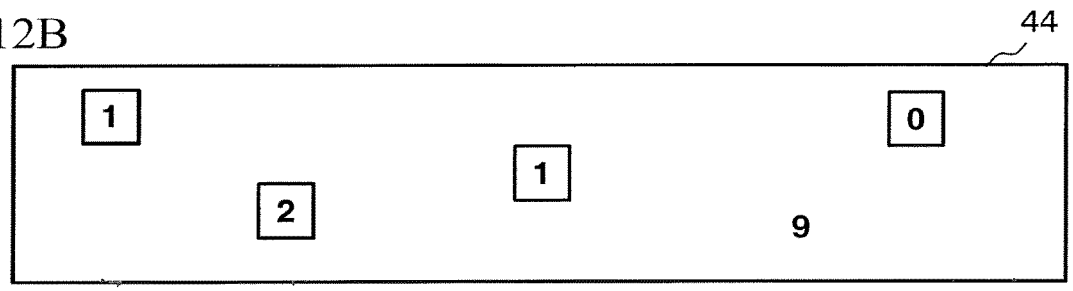
Figure 12C:
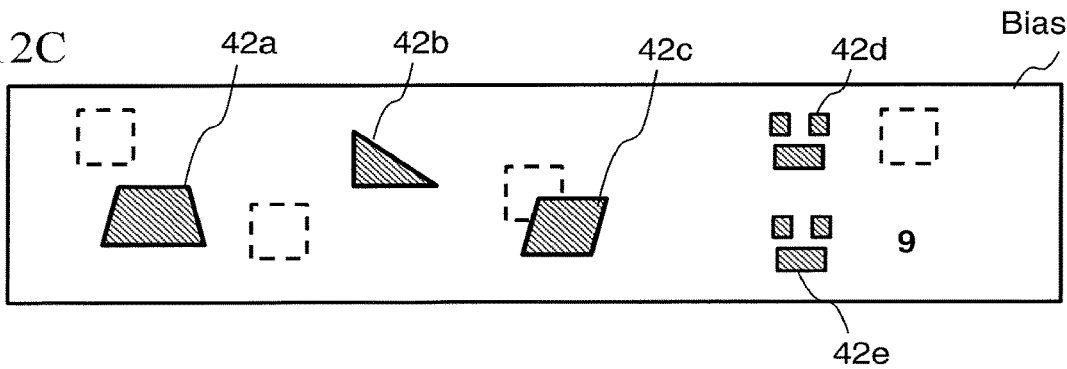

FIGS. 12A to 12C show other examples of patterns each at each stage in a writing method according to the first embodiment. FIG. 12A shows an example of a defective pattern formed by a defective beam, and an identifier indicating the dose of each defective pattern. Specifically, FIG. 12A shows defective patterns 40a to 40d, each being a defective region, formed by defective beams. Each of the unnecessary doses of the defective patterns 40a and 40c is indicated by the identifier "8". The identifier 8 indicates 8 or 80% of the dose based on a standard where the reference unnecessary dose is regarded as 10, for example. Similarly, the unnecessary dose of the defective pattern 40b is indicated by the identifier "7". The identifier 7 indicates 7 or 70% of the dose based on a standard where the reference unnecessary dose is regarded as 10, for example. Similarly, the unnecessary dose of the defective pattern 40d is indicated by the identifier "9". The identifier 9 indicates 9 or 90% of the dose based on a standard where the reference unnecessary dose is regarded as 10, for example. The region around (that is excluding) the defective patterns 40a to 40d is indicated by the identifier "0". The identifier 0 indicates 0 or 0% of the dose based on a standard where the reference unnecessary dose is regarded as 10, for example. In other words, it indicates a zero dose.

With respect to the reverse pattern 44 generated by reversing the pattern data of the defective pattern, as shown in FIG. 12B, the reversed dose of the region other than the defective patterns 40a to 40d is indicated by the identifier "9". The identifier 9 indicates 9 (or 90%) of the dose based on a standard where the reference unnecessary dose is regarded as 10, for example. The dose for bias should be equivalent to the maximum in the unnecessary doses of a plurality of defective patterns 40a to 40d. Thus, reversing should be performed on the basis of the unnecessary dose (identifier "9") of the defective pattern 40d which is irradiated with the maximum unnecessary dose in a plurality of defective patterns 40a to 40d. Then, each of the reversed unnecessary doses in the regions of the defective patterns 40a and 40c is indicated by the identifier "1" which is the difference between the identifier 8 and the identifier 9 being the maximum unnecessary dose. The identifier 1 indicates 1 (or 10%) of the dose based on a standard where the reference unnecessary dose is regarded as 10, for example. Similarly, the reversed unnecessary dose of the region of the defective pattern 40b is indicated by the identifier "2". The identifier 2 indicates 2 (or 20%) of the dose based on a standard where the reference unnecessary dose is regarded as 10, for example. Similarly, the reversed unnecessary dose of the region of the defective pattern 40d is indicated by the identifier "0". The identifier 0 indicates 0 (or 0%) of the dose based on a standard where the reference unnecessary dose is regarded as 10, for example. In other words, it indicates a zero dose. The reversed unnecessary dose or the identifier indicating the reversed unnecessary dose is defined in the pixel data of the reverse pattern data after rasterization, for each control pixel 27.

By irradiating each control pixel 27 with the beam dose based on the combined-value pixel data which is obtained by adding pixel data of the reverse pattern to pixel data of writing data, as shown in FIG. 12C, unnecessary doses of 80%, 70%, 80%, and 90% of the reference unnecessary dose respectively enter the regions of defective patterns 40a to 40d by defective beams. On the other hand, by normal beams, reversed unnecessary doses of 10%, 20%, 10%, 0%, and 90% of the reference unnecessary dose respectively enter the defective patterns 40a to 40d, and the region other than the defective patterns 40a to 40d. By this, the whole of the writing region (here, stripe region 32) is biased (offset) by the maximum unnecessary dose (identifier "9"). Thus, the base of the dose for bias can be formed as if the defective patterns 40a to 40d themselves do not exist.

Figure 13A:
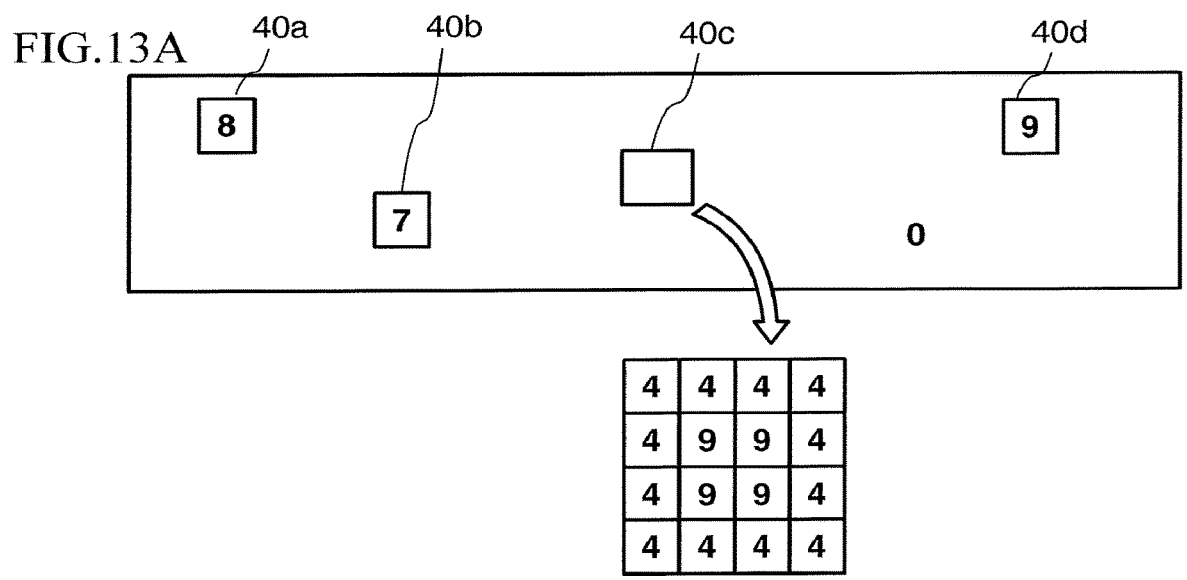
FIGS. 13A and 13B show other examples of patterns each at each stage of the writing method according to the first embodiment.
Figure 13B:
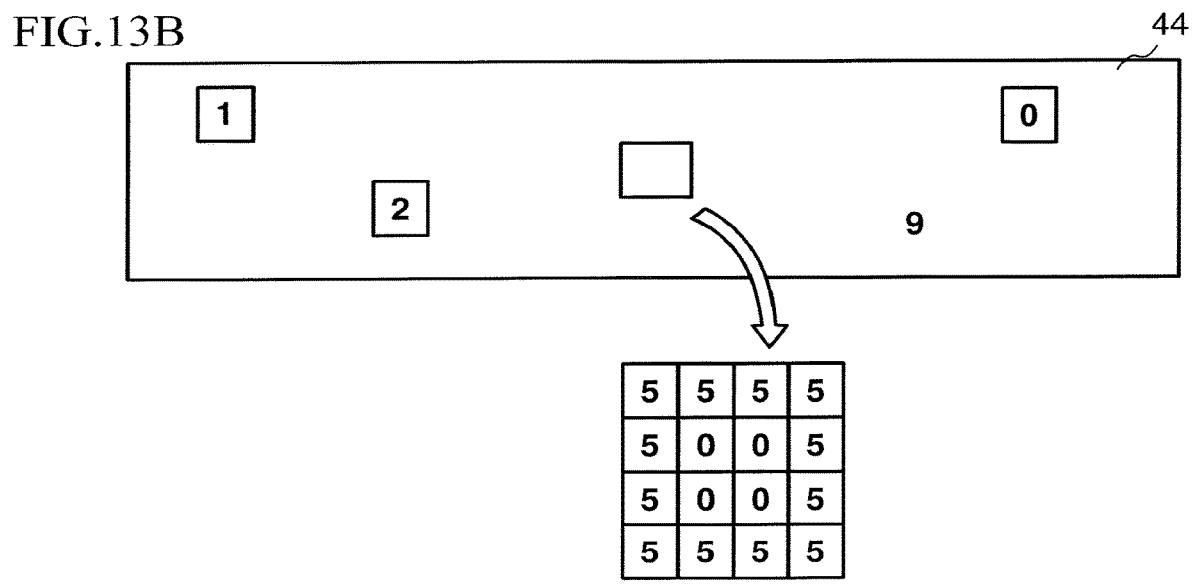

FIGS. 13A and 13B show other examples of patterns each at each stage of the writing method according to the first embodiment. The defective patterns 40a to 40d might have an unnecessary dose whose distribution is various (non-uniform) in the region of the defective pattern. FIG. 13A shows the defective patterns 40a to 40d each being a defective region formed by a defective beam. The defective pattern 40c in the defective patterns 40a to 40d has an unnecessary dose whose distribution is various (non-uniform) in the region of the defective pattern. The other contents of FIG. 13 are the same as those of FIG. 12A. Then, according to the first embodiment, with respect to the defective pattern 40c whose distribution of the unnecessary dose is various, it is also preferable to generate defective pattern data as a gray map in which the dose is defined for each segmented mesh. In the example of FIG. 13A, the region of the defective pattern 40c is divided into 4×4 mesh regions, and the unnecessary dose in each mesh is defined as a mesh value. In the case of FIG. 13A, the unnecessary dose of each of the central 2×2 mesh regions in the 4×4 mesh regions is defined by the identifier "9", and the unnecessary dose of each of the peripheral mesh regions is defined by the identifier "4".

With respect to the reverse pattern 44 generated by reversing the pattern data of the defective pattern, as shown in FIG. 13B, the contents other than the defective pattern 40c are the same as those of FIG. 12B. For example, the reversed dose of the region other than the defective patterns 40a to 40d is indicated by the identifier "9". In the region of the defective pattern 40c, the reversed unnecessary dose of each of the central 2×2 mesh regions in the 4×4 mesh regions is defined by the identifier "0" which is the difference between the identifier 9 and the maximum unnecessary dose (being the identifier "9"), and the unnecessary dose of each of the peripheral mesh regions is defined by the identifier "5". The reversed unnecessary dose or the identifier indicating the reversed unnecessary dose is defined in the pixel data of the reverse pattern data, for each control pixel 27.

By irradiating each control pixel 27 with the beam dose based on the combined-value pixel data which is obtained by adding pixel data of the reverse pattern to pixel data of writing data, the whole of the writing region (here, stripe region 32) is biased (offset) by the maximum unnecessary dose (identifier "9"). Thus, the base of the dose for bias can be formed as if the defective patterns 40a to 40d themselves do not exist. In each data described above, the mesh size of the gray map can be precisely corrected by being set to be smaller than the size of the pixel 36. For example, it is preferable to set to be about ½ of the size of the pixel 36. In the reverse pattern data, with respect to the region of the defective pattern 40c used in the gray map, conversion to pixel data may preferably be performed based on pixelation grid information with regarding each mesh of the gray map as a mesh size figure with an identifier. Thereby, when performing conversion to pixel data, it is possible to execute the conversion while maintaining the resolution of the dose having been set in the gray map, and therefore, the setting precision of the dose can be increased. In that case, although the number of reference figures increases in the gray map when pixelation is performed, since the portion of the gray map is assumed to be small compared to the total number of the figures, there is no particular problem. If throughput capacity is insufficient, some processing resource may be additionally prepared.

In the representation form applying the gray map described above, it is possible to represent a dose profile (irradiation shape) in detail in the case where the irradiation shape of a defective beam differs from the original beam shape, and the resolution has been changed due to the shape change or astigmatism, etc. Thus, as an example of an unnecessary exposure pattern, using the gray (gradation) map based on the concept of a representative figure is suggested. Conventionally, the concept of a representative figure, which represents the area of the small region (mesh) by making one figure, as a representative, represent figures included in small region units, has been proposed for increase in efficiency of calculation of proximity effect correction. By applying the concept of the representative figure, it is possible to represent the change of the entire gradation by showing the gradation level of the whole meshes by using the area ratio in each mesh. Here, in order to represent the change of the entire gradations, if not the figure in the mesh but the area or the area ratio (=gradation level) inside the mesh is used instead of arranging one figure in the mesh in order to represent the area ratio in the mesh as described above, the data amount relating to the shape becomes unnecessary, and therefore the data amount can be reduced. Thus, it can similarly represent the entire gradation even if the overall shape for representing change of gradation is a rectangle, and the gradation is defined, in the form of mesh, inside the rectangle. In that case, the sizes of the meshes may not be uniform in the representative figure. In processing, it is convenient to represent, for each mesh, the gradation level as an identifier indicated by a standardized relative value, ratio, or percentage.

In the examples of FIGS. 20A to 20C, a gray map is shown where the irradiation shape spreads especially in the x direction due to astigmatism and the like, and the shape is different on the right and left sides, compared with the original beam irradiation shape (dotted line). The region of the central 2×2 of the gray map (FIG. 20A) shows the original beam irradiation shape. With respect to the x direction, addition has been performed to the right and left sides of the central 2×2 region to represent the irradiation shape. Thereby, it is possible to represent the irradiation shape which has the same shape in the y direction (FIG. 20C) as the original beam irradiation shape, and the different shape in the x direction (FIG. 20B) on the right and left sides, compared with the original beam irradiation shape (dotted line). Thus, by using the gray map, the irradiation shape which is different on the left, right, top, and bottom sides can also be represented. As shown in the examples of the irradiation shape in FIGS. 20A to 20C, the actual irradiation shape becomes a shape with a skirt due to that the influence by beam resolution is added to the specified irradiation shape (gradation shape of the gray map in FIGS. 20A to 20C). If desiring to obtain correction accuracy considering the influence of the beam resolution, it is sufficient to generate a gray map by subtracting the amount of the influence. Thus, by using the gray map, an arbitrary irradiation shape can be represented. If the downstream processing system is a type that does not accept the gradation representation, that is, if the downstream processing system is the conventional 0/1 (white/black) representation type, the same processing as that of the gray map can be executed by representing the gradation by using the representative figure representing the shape and size for each mesh.

When actually generating a defective pattern (unnecessary exposure pattern), which of the normal figure and the gray map is to be used should preferably be selected depending on required accuracy. The defective pattern (unnecessary exposure pattern) is used to set a corrected irradiation shape for equalizing the bias. In the case where sufficient accuracy cannot be achieved due to difference of exposure shape (exposure profile) even if corrected irradiation is performed using a normal figure, a more detailed shape can be specified using the gray map. For setting a corrected irradiation shape more finely, the mesh size of the gray map is made finer. However, if the mesh size is made too fine, it is restricted by the beam resolution when executing writing. That is, if the mesh size is made minute (fine) enough to represent the gradation which can be represented by the beam resolution at the time of writing, gradation finer than the one restricted by beam resolution cannot be executed even if it is made more finer. For example, in the case of a 10 nm beam, 5 nm pixel, and 5 nm beam resolution (=σ value), if the mesh size of the gray map is made fine such as about 2.5 nm, for example, ½ or ¼ of the pixel size, this mesh size can thoroughly represent fineness which can be represented by the beam resolution. Not limited to this example, since a setting error of corrected irradiation can be estimated by simulation and the like depending on the mesh size, the mesh size may be determined according to required accuracy.

Although it has been assumed that the settling time for shifting the beam irradiation position is sufficiently small, if generation of a shape with a skirt at the bottom and the like cannot be disregarded because of defective beam irradiation occurring during a deflection movement during the settling, correction with sufficient accuracy can be achieved by including the irradiation shape of during the settling time, as an unnecessary exposure pattern. Thus, by using the gray map, it is possible to perform correction including fine differences, such as a difference of the dose of each defective beam, a difference of the irradiation shape including influence of settling time shortage at the time of irradiation position shifting, and the like. Moreover, not only to the case of unnecessary exposure by an always-on defective beam, the present method can be applied also to the case of latent (dormant) unnecessary irradiation such as a leaked beam by unnecessary reflection or scattering of an electron beam, a leaked beam during a blanking operation, and the like. Although there is concern for data amount increase when the gray map is used too frequently, if it is assumed that the number of defective beams is minute in comparison to the number of all the beams, it suffices to represent only the portion of the defective beam by using a representative figure, and therefore, the data amount does not increase so excessively.

Figure 14A:
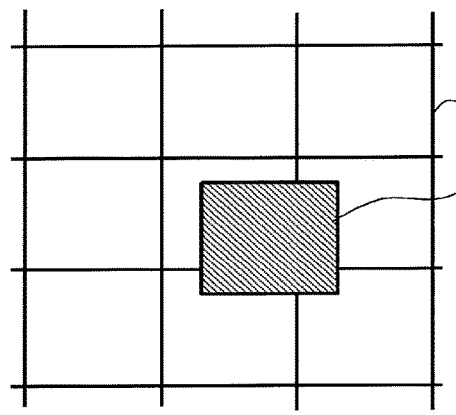
FIGS. 14A to 14E illustrate a difference of the dose for bias between the first embodiment and a comparative example.
Figure 14B:
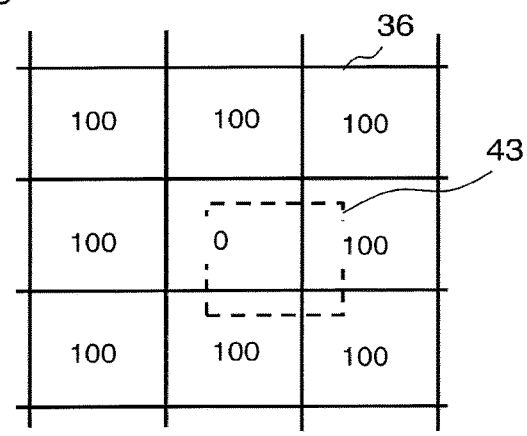
Figure 14C:
Figure 14D:
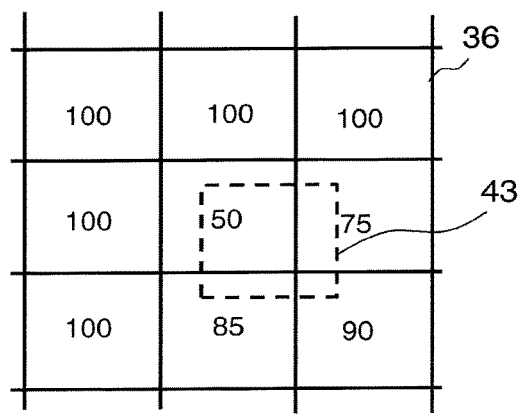
Figure 14E:

FIGS. 14A to 14E illustrate a difference of dose for bias between the first embodiment and a comparative example as a simple method. The comparative example shows the case where a dose for bias is uniformly applied to each control pixel 27 other than the control pixel irradiated with a defective beam after rasterization. In the case of FIG. 14A, the position of an irradiation pattern 43 by a defective beam is displaced from the control pixel 27 and the pixel 36. In the comparative example, since the dose for bias is uniformly applied to each control pixel 27 other than the control pixel irradiated with a defective beam after rasterization, even if the position of the irradiation pattern 43 by a defective beam is displaced from the pixel 36 as shown in FIG. 14B, the dose for bias of the control pixel 27 corresponding to the pixel 36 is zero, and the doses for bias of the other control pixels 27 are individually 100% compared to the reference unnecessary dose. Therefore, even if the dose for bias is added, the dose distribution of unnecessary irradiation to be corrected has a peak at the corresponding pixel center (control pixel 27) as shown in FIG. 14C, and therefore, there is displaced from the center of the irradiation pattern 43 by a defective beam. Accordingly, the dose for bias on the target object 101 is not uniform. Thus, the dimension of the writing pattern formed on the target object 101 deviates. On the other hand, according to the first embodiment, since the data of a defective pattern is generated before rasterization regardless of the region of the pixel 36, it is possible to distribute the dose for bias depending on the area density of the defective pattern by rasterizing processing. Thus, as shown in FIG. 14D, when the position of the irradiation pattern 43 by a defective beam is partially displaced to the lower right in FIG. 14D from the object pixel 36, a part of the control pixel 27 concerned, from which the dose for bias has been displaced, remains to be 50%, and each of the doses for bias of the three control pixels 27, to which the doses for bias have been displaced, is reduced by the amount of the displacement to be 85% (the lower one), 90% (the lower right one), and 75% (the right one) of the reference unnecessary dose. The dose for bias of the control pixel 27 which does not overlap with the irradiation pattern 43 by a defective beam is 100% compared to the reference unnecessary dose. Therefore, it becomes possible to make the dose distribution of unnecessary irradiation to be corrected by being added by the dose for bias have a peak at the center of the irradiation pattern 43 by a defective beam as shown in FIG. 14E. Accordingly, the dose for bias on the target object 101 can be made uniform. Thus, the dimension deviation of the writing pattern formed on the target object 101 can be suppressed or avoided.

FIGS. 15A to 15D illustrate examples of dose correction by multiple writing according to the first embodiment. FIGS. 15A to 15D show the cases where multiple writing of 8 times (when additional pass is added, (8+1) passes) is performed while shifting the position. By performing multiple writing by (8+1) passes while performing shifting for each pass, the dose by a defective beam is applied to only 1 pass of (8+1) passes, and the dose for bias and the dose for writing pattern are divided into 8 passes of the (8+1) passes. FIG. 15A shows the case where, with respect to the regions of 5×6 pixels (or control pixels), for example, the pixel (or control pixel) in the fifth row from the bottom and the second column from the left, and the pixel (or control pixel) in the second row from the bottom and the fifth column from the left are irradiated with defective beams. When performing 8+1 pass writing while shifting the position, an unnecessary dose enters one of the (8+1) passes. If the defective beam is an always-on beam, the maximum dose (100%) for one pass becomes an unnecessary dose. This unnecessary dose is here regarded as a ⅛ dose. Therefore, the ⅛ dose is needed as a dose for bias for other pixels. When applying this dose for bias by performing 8 pass writing processing, 1/64 (=1/(8×8)) dose enters, at each applying time, the pixels other than the pixel irradiated with the defective beam as shown in FIG. 15B. ⅛ dose can be achieved (totally applied) by repeating 8-pass writing processing. In the example of FIG. 15C, writing pattern is written in the 2×3 pixels (or control pixels) in the third to fifth rows from the bottom and second to third columns from the left, for example. When applying the dose needed for the writing pattern to the pixels described above by dividing the dose into eight passes, the maximum dose (100%) (=unnecessary dose) for one pass is applied to all the passes. Therefore, ⅛ dose enters at each applying time. Accordingly, when performing 8+1 pass writing processing, totally 9/8 dose enters each of the 2×3 pixels (or control pixels), in each of which a writing pattern is formed, as shown in FIG. 15D. Moreover, ⅛ dose enters each of the remaining pixels. Therefore, it turns out that ⅛ dose is applied as a dose for bias to all the pixels. Accordingly, pattern dimension variation by an always-on beam can be corrected. Moreover, by performing (8+1) pass multiple writing while shifting the position, the influence of an always-on beam can be suppressed to ⅛ compared to the multiple writing without shifting the position. In contrast, if performing 4+1 pass multiple writing while shifting the position, the influence of an always-on beam can be suppressed to only ¼ compared to the multiple writing without shifting the position. Thus, the more the multiple times (the number of passes) is, the much the influence of an always-on beam can be reduced.

As described above, according to the first embodiment, even when there is generated in the multiple beams 20 a defective beam such as an always-on beam which irradiates a target with a dose being larger than a control dose and including an unnecessary dose, it is possible to execute writing with great accuracy. Moreover, when the position of the control pixel 27 and the irradiation pattern position by a defective beam are displaced from each other, the correction accuracy can be improved compared to the conventional one.

Moreover, compared to the conventional methods, such as a method of forming a shutter mechanism to limit the beam region to be used, a method of blocking the aperture hole at the portion concerned by using an FIB, etc., and a method of cutting off or blocking a beam by using either one of two stages of blanking deflection, it is possible according to first embodiment to execute writing with great accuracy without being affected by an always-on beam, by applying, as a dose for bias, the same dose as that by an always-on beam, etc. to the whole surface without making a special mechanism.

The conventional method of applying a dose for bias whose amount is equal to that of an always-on beam to the whole surface of the writing region by uniformly adding a dose (offset dose) to pixels after rasterization, and the comparative example being a simplified method have an advantage that an effect can be expected to some extent. However, since just uniform corrected irradiation is applied to each pixel in these methods, pattern dimension deviation may occur as explained with reference to FIGS. 14A to 14E, and therefore, it is difficult to acquire sufficient accuracy to the recent demand of high accuracy. In contrast, according to the first embodiment, sufficient accuracy can be acquired to the recent demand of high accuracy.

Now, based on the first embodiment described above, problems of the conventional method, and improvement of the first embodiment are explained below.

(1) Response to Difference of Each Beam Intensity

In multiple beam (MB) writing, the current (intensity) may be various due to illumination non-uniformity, opening shape non-uniformity and the like. For satisfying the dose accuracy meeting the recent demand of accuracy for pattern formation, accuracy of 1% or less is required. However, it is actually difficult to guarantee the uniformity of beam intensity to be 1% or less because of illumination non-uniformity, opening shape non-uniformity and the like. Therefore, in the writing apparatus 100, non-uniformity of the beam intensity can be compensated by using the irradiation time. However, since the irradiation time of an always-on beam cannot be controlled from the beginning, it is impossible to aim at uniformity by controlling the irradiation time, and furthermore, the dose of an always-on beam fluctuates depending on the beam intensity. Therefore, a method which can respond to intensity fluctuation of each beam is required.

On the other hand, according to the first embodiment, it is possible to write (or represent) gradation of a figure (corresponding to the amount of dose), and execute irradiation for obtaining a uniform dose for bias even with respect to an unnecessary beam having a different intensity.

(2) Response to Problem of not Guaranteeing that Beam Irradiation Position is the Same as Pixel Position of Each Pass In MB writing, distortion of a writing field (beam array region) is one of main problems to be solved. If there is distortion, the writing positions are not uniform. In that case, actually, irradiation is applied not to the exact pixel position but to a position deviated depending on the distortion. Therefore, even if corrected irradiation is performed for each pixel on the premise that the exact pixel position is to be irradiated, as long as there is deviation due to distortion, uniform irradiation cannot be achieved. Thus, shape fluctuation of a writing pattern may occur. That is, the irradiation position of a defective beam deviates from the pixel position, and the corrected irradiation position deviates from the pixel position. As a result, since the irradiation position of a defective beam and the irradiation position of a correction beam are displaced from each other, a portion where the irradiation bias amount is not uniform is generated. Therefore, a method which can respond to deviation of a beam irradiation position is required.

On the other hand, according to the first embodiment, it is possible to perform irradiation to acquire a uniform dose for bias without deviation, using the normal positional deviation correction function provided in MB writing, by writing (or representing) the irradiation position (and irradiation shape) of a defective beam and the irradiation position (and irradiation shape) of a corresponding correction beam based on writing data before pixelation, not on raster data after pixelation.

(3) Concerning High Accuracy Method for Correcting Positional Deviation by Using Dose When generating the raster data, generally, pixelation (rasterization using a uniform grid) is performed by a method which obtains a figure area in a pixelation grid being uniform in x and y directions on the writing surface. As a result, the raster data of the pixel size being the same in the x and y directions is generated. On the other hand, according to the first embodiment, deviation of the irradiation position is corrected by performing writing using writing raster data generated by pixelation in accordance with a variable pixelation grid which is set depending on deviation of a beam irradiation position.

According to the first embodiment, corresponding to deviation of the irradiation position of a beam, pixelation (rasterization) is performed using a pixelation grid which is set to be non-uniform in x and y directions on the writing surface. In that case, the area in each grid is calculated and pixelated based on information specifying the grid position, (that is rasterization using non-uniform grid). Here, since the sizes of the pixels are not equal to each other, if performing correction for equaling the bias by pixel calculation after pixelation, complicated processing is needed. For example, the dose in the case of there being an always-on defective beam should be converted using the pixel size of the irradiation position of the defective beam. When uniformly applying the dose to the whole surface, it is necessary to calculate the dose being different for each pixel, depending on the pixel size.

Therefore, according to the first embodiment, even in the case of a non-uniform grid, since it is possible to perform writing by generating a pattern used for bias correction, as writing data, and generating writing raster data by the same rasterization processing as that for normal writing, the writing can be executed without any additional complicated processing system and additional resource that are necessary for pixel calculation.

Furthermore, according to the first embodiment, deviation due to grid position deviation can be avoided by using the same grid information. Besides, in the first embodiment, a pattern used for bias correction and a writing pattern are rasterized by using the same pixelation grid, and, then, for performing writing, writing raster data is generated by carrying out addition and subtraction between raster data of the pattern for bias correction and raster data of the writing pattern for each pixel. Thus, by executing rasterization using the same pixelation grid, a pattern for bias correction is generated as writing data whether the pixelation grid is a uniform grid or a non-uniform grid. Since, in performing rasterization, writing raster data is generated based on the same pixelation grid as that of a writing pattern, no positional deviation occurs in both the patterns, thereby performing correction writing with great precision.

(4) Countermeasure for the Case of there being Intensity Distribution in Shape of Unnecessary Dose When there is an intensity distribution in unnecessary dose, that is, for example, when resolutions in the x and y directions are different due to astigmatisms and the like, complicated processing of a huge amount is needed in a conventional method where calculation is performed per pixel, thereby being inexecutable.

On the other hand, according to the first embodiment, by writing (or representing) a gradation and an intensity distribution of a pattern for bias correction, it becomes possible to perform bias correction writing with great accuracy even when there is an intensity distribution in unnecessary dose.

Second Embodiment

In the above first embodiment, pixel data for a dose for bias is generated by rasterizing the reverse pattern of a defective pattern formed by a defective beam. However, it is not limited thereto.

Figure 16:
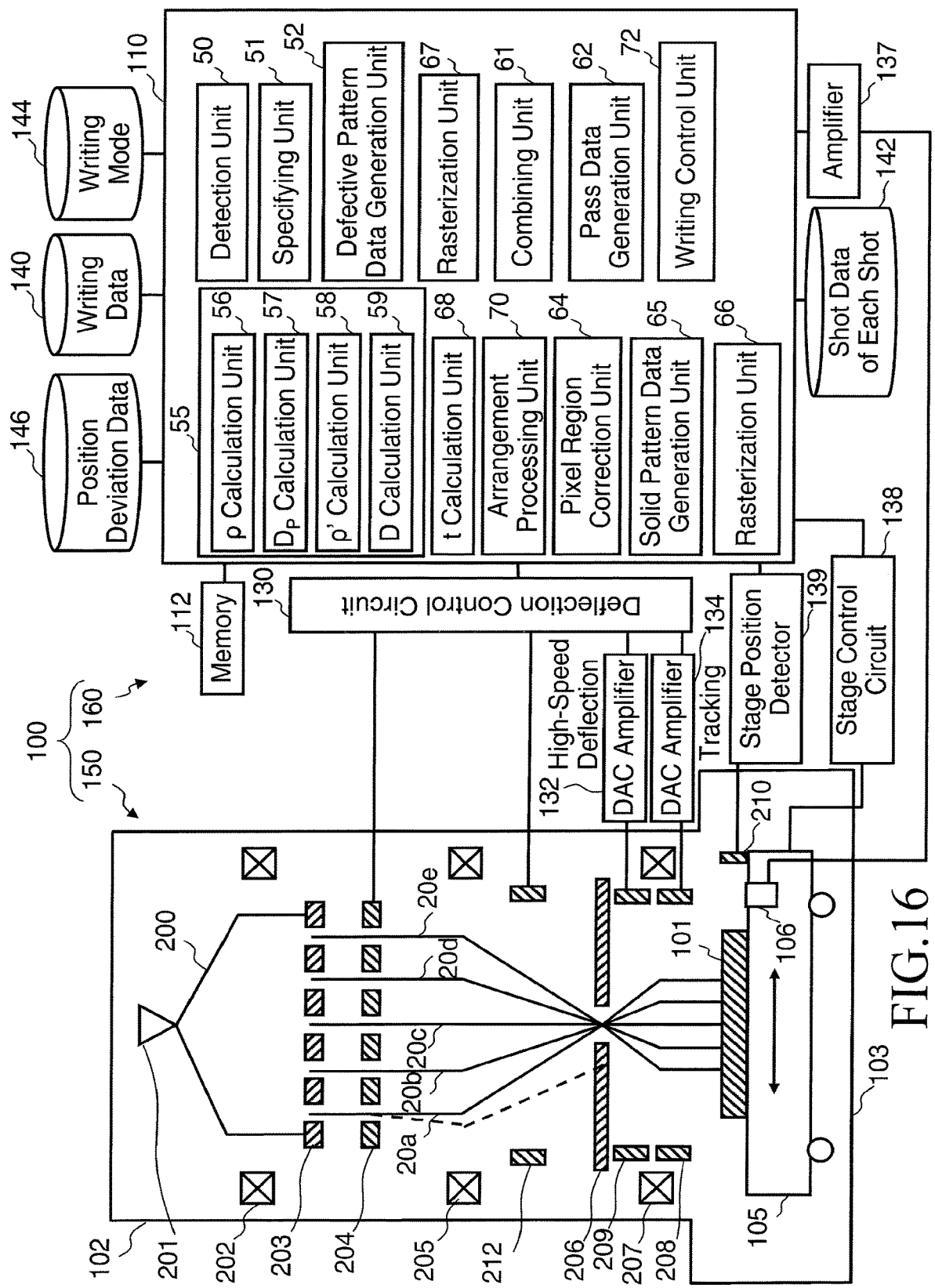
FIG. 16 is a conceptual diagram showing a configuration of a writing apparatus according to a second embodiment.

FIG. 16 is a conceptual diagram showing a configuration of a writing apparatus according to a second embodiment. FIG. 16 is the same as FIG. 1 except that a combining unit 61, a solid pattern data generation unit 65, and rasterization units 66 and 67 are arranged instead of the reversing unit 53, the rasterization unit 54, and the combining unit 60.

Each of the " . . . units" such as the detection unit 50, the specifying unit 51, the defective pattern data generation unit 52, the rasterization unit 55 (area density calculation unit 56, corrected irradiation coefficient calculation unit 57, area density calculation unit 58, and dose calculation unit 59), the combining unit 61, the pass data generation unit 62, the pixel region correction unit 64, the solid pattern data generation unit 65, the rasterization units 66 and 67, the irradiation time calculation unit 68, the arrangement processing unit 70, and the writing control unit 72 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the detection unit 50, the specifying unit 51, the defective pattern data generation unit 52, the rasterization unit 55 (area density calculation unit 56, corrected irradiation coefficient calculation unit 57, area density calculation unit 58, and dose calculation unit 59), the combining unit 61, the pass data generation unit 62, the pixel region correction unit 64, the solid pattern data generation unit 65, the rasterization units 66 and 67, the irradiation time calculation unit 68, the arrangement processing unit 70, and the writing control unit 72, and information being operated are stored in the memory 112 each time.

Figure 17:
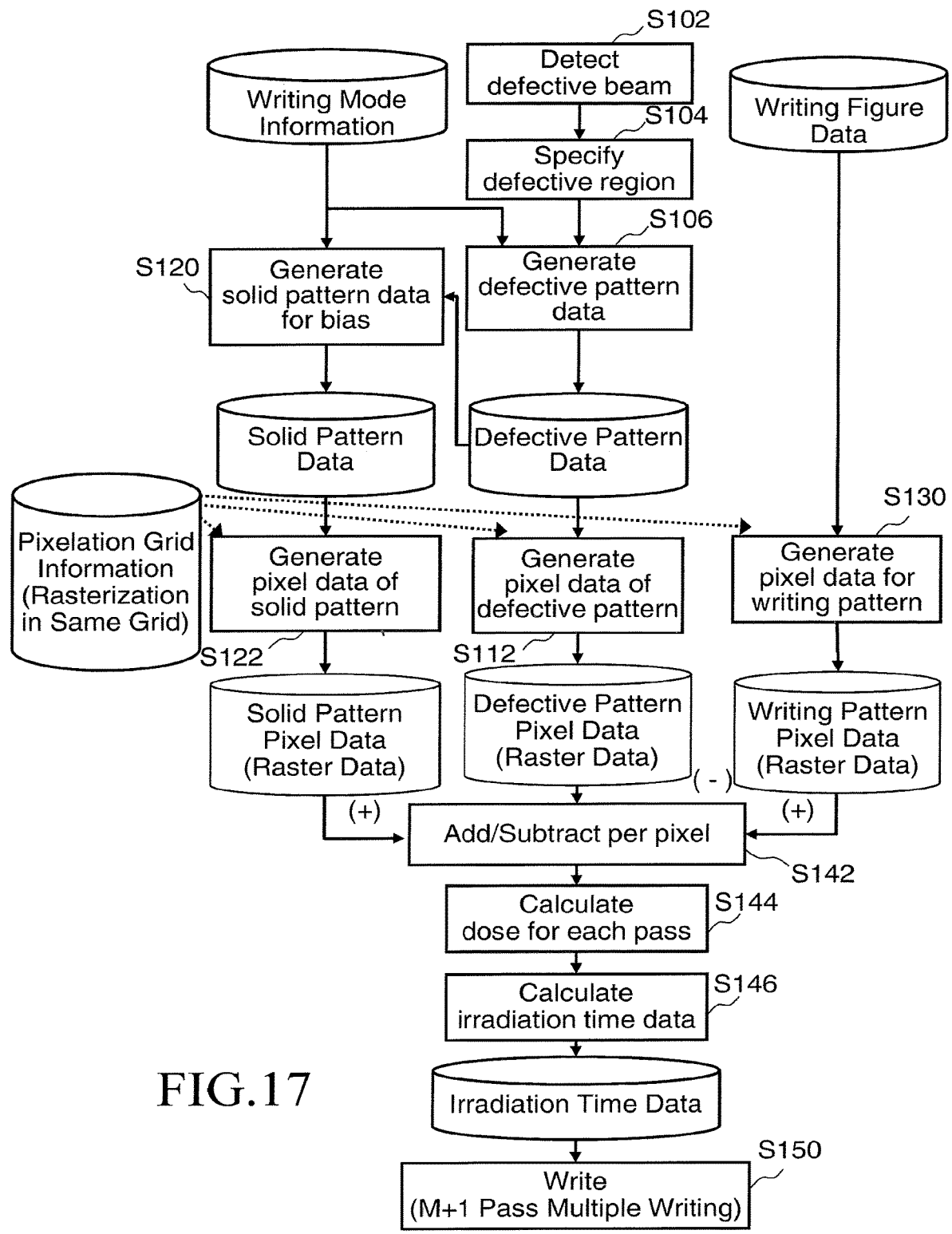
FIG. 17 is a flowchart showing main steps of a writing method according to the second embodiment.

FIG. 17 is a flowchart showing main steps of a writing method according to the second embodiment. In FIG. 17, the writing method of the second embodiment executes a series of steps: the defective beam detecting step (S102), the defective region specifying step (S104), the defective pattern data generating step (S106), a defective pattern pixel data generating step (S112), a solid-pattern-for-bias data generating step (S120), a solid pattern pixel data generating step (S122), the writing pattern pixel data generating step (S130), a combining step (S142), the dose calculating step (S144) for each pass, the irradiation time data calculating step (S146), and the writing step (S150).

The contents of the second embodiment are the same as those of the first embodiment except for what is specifically described below. The contents of each of the defective beam detecting step (S102), the defective region specifying step (S104), and the defective pattern data generating step (S106) are the same as those of the first embodiment. In the defective pattern data generating step (S106), the defective pattern data generation unit 52 generates defective pattern data of a defective pattern having the shape of a defective region in the writing region (e.g., stripe region 32). In the defective pattern data, for example, the figure type, coordinates, and pattern size are defined. Furthermore, an unnecessary dose or an identifier indicating the unnecessary dose is defined as additional data. When there are a plurality of defective regions having different unnecessary doses as described with reference to FIGS. 12A to 12C and FIGS. 13A and 13B, the defective pattern data generation unit 52 generates defective pattern data in which a plurality of defective patterns having different unnecessary doses are defined, and further, a value corresponding to the unnecessary dose related to each defective pattern is defined.

Thus, when performing writing in a writing mode specified in advance, the portion to be written by a defective beam is estimated to generate corresponding writing data (defective pattern: unnecessary exposure pattern).

In the defective pattern pixel data generating step (S112), the rasterization unit 66 (defective pattern data conversion unit) converts defective pattern data into defective pattern pixel data in which a value corresponding to the dose for each control pixel 27 is defined. First, the writing control unit 72 inputs writing mode information from the storage device 144, and associates, for each stripe region 32, each control pixel 27 in the stripe region 32 concerned with a beam related to each control pixel 27 concerned, in accordance with the writing sequence. The writing control unit 72 inputs pixelation grid information generated beforehand from the storage device 146, and associates the position of each control pixel 27 with the position of a pixelation grid.

The rasterization unit 66 (defective pattern data conversion unit) calculates, for each control pixel 27, the area density $\rho''$ of a defective pattern defined in defective pattern data of the pixel 36 of the control pixel 27 concerned, using the position of each control pixel 27 and the region of each pixel 36 defined in pixelation grid information. In the case of FIG. 9, an area density S of the figure pattern 37 arranged in the pixel 36 of the control pixel $R(x_n, y_n)$ is calculated. Dimension deviation and the like of a written pattern occurring along with positional deviation of a beam irradiation position can be corrected by correcting the position of each control pixel 27 and the region of each pixel 36.

The rasterization unit 66 calculates, for each control pixel 27, a standardized dose (value corresponding to dose) by multiplying the calculated area density $\rho''$ of the defective pattern by an unnecessary dose of the defective pattern concerned. In that case, if there are a plurality of defective pattern figures related to the pixel 36 concerned, the rasterization unit 66 calculates a standardized dose of the control pixel 27 by calculating the area density $\rho''$ for each defective pattern figure, calculating a standardized dose (value corresponding to dose) by multiplying the area density $\rho''$ of each defective pattern figure by an unnecessary dose of the defective pattern figure concerned, and adding standardized doses of a plurality of related defective pattern figures. The standardized dose (dose coefficient) is indicated by a relative value, ratio, or percentage value standardized based on the criterion that the reference dose is regarded as 100 (alternatively, 1 or 10). Then, the rasterization unit 66 generates defective pattern pixel data which defines the dose standardized for each control pixel 27. Alternatively, the dose D(x) may be calculated as an incident dose itself which is obtained by multiplying the reference dose, the area density $\rho''$ of the defective pattern, and the unnecessary dose of the defective pattern concerned. The defective pattern pixel data serves as raster data of a defective pattern.

Alternatively, when the unnecessary dose defined in defective pattern data is defined by a standardized relative value, ratio, or percentage based on the criterion that the reference unnecessary dose being the beam dose applied during the maximum irradiation time Ttr of one shot is regarded as 100 (alternatively, 1 or 10), the rasterization unit 66 calculates, for each control pixel 27, a standardized dose (value corresponding to dose) by multiplying the calculated area density $\rho''$ of the defective pattern, the unnecessary dose of the defective pattern concerned, and the ratio which is obtained by dividing the reference unnecessary dose by the reference dose. Thus, by performing multiplication using the ratio obtained by dividing the reference unnecessary dose by the reference dose, it is possible to match the standardized dose with the ratio of the case where the reference dose is regarded as 100 (alternatively, 1 or 10). Alternatively, the dose D(x) may be calculated as an incident dose itself which is obtained by multiplying the reference unnecessary dose, the area density $\rho''$ of the defective pattern, and the unnecessary dose of the defective pattern concerned.

FIGS. 18A to 18E show examples of patterns at each stage in a writing method according to the second embodiment. FIGS. 18A, 18B, 18D, and 18E are the same as FIGS. 8A, 8B, 8D, and 8E. In the first embodiment, after converting defective pattern data into reverse pattern data, pixel data of the reverse pattern data is generated. However, in the second embodiment, defective pattern data, as it is, is converted into pixel data without generating reverse pattern data. Instead, a solid pattern described below is used.

In the solid-pattern-for-bias data generating step (S120), the solid pattern data generation unit 65 generates solid pattern data in which the whole writing region (here, stripe region 32) is regarded as a pattern. The solid pattern 45 is generated with regarding the whole stripe region 32 as a pattern as shown in FIG. 18C. Therefore, in the case of FIG. 18C, the whole of the stripe region 32 is formed as having a figure pattern. In the defective pattern data, for example, the figure type, coordinates, and pattern size are defined. Furthermore, a dose for bias or an identifier indicating the dose for bias is defined as additional data. Preferably, the maximum unnecessary dose of a defective pattern is used as a dose for bias. When each of the defective patterns 40a to 40d is formed by an always-on beam, for example, the dose for bias is 100% compared to the reference unnecessary dose. It is sufficient for the dose for bias to be the maximum unnecessary dose of a plurality of defective patterns 40a to 40d. Therefore, for example, as shown in FIG. 12A, if there are a plurality of defective patterns 40a to 40d of the unnecessary dose (identifier "8"), unnecessary dose (identifier "7"), unnecessary dose (identifier "8"), and unnecessary dose (identifier "9"), the unnecessary dose (identifier "9") of the defective pattern 40d being the maximum unnecessary dose is used as the dose for bias.

In the solid pattern pixel data generating step (S122), the rasterization unit 67 (solid pattern data format conversion unit) converts solid pattern data into solid pattern pixel data in which the value corresponding to the dose for each control pixel 27 is defined.

The rasterization unit 67 (solid pattern data conversion unit) defines, for each control pixel 27, a dose for bias as a standardized dose (value corresponding to dose), using the position of each control pixel 27 and the region of each pixel 36 defined in pixelation grid information. The standardized dose (dose coefficient) is indicated by a relative value, ratio, or percentage value standardized based on the criterion that the reference dose is regarded as 100 (alternatively, 1 or 10). If the control pixel 27 is set by using a uniform grid, since the pattern area density of a solid pattern is 100%, the dose for bias should be defined for each control pixel 27. Alternatively, the dose D(x) may be calculated as an incident dose itself which is obtained by multiplying the reference dose by the dose for bias of a solid pattern. If the control pixel 27 is set by using a non-uniform grid, since the area of the pixel 36 of each control pixel 27 is different from each other, the dose for bias corresponding to the area should be defined as a standardized dose (value corresponding to dose). The solid pattern pixel data serves as raster data of a solid pattern.

Alternatively, when the unnecessary dose defined in solid pattern data is defined by a standardized relative value, ratio, or percentage based on the criterion that the reference unnecessary dose being the beam dose applied during the maximum irradiation time Ttr of one shot is regarded as 100 (alternatively, 1 or 10), the rasterization unit 67 calculates, for each control pixel 27, a standardized dose (value corresponding to dose) by multiplying the dose for bias of a solid pattern corresponding to the area of the pixel 36 of the control pixel 27 by the ratio which is obtained by dividing the reference unnecessary dose by the reference dose. Thus, by performing multiplication using the ratio obtained by dividing the reference unnecessary dose by the reference dose, it is possible to match the standardized dose with the ratio of the case where the reference dose is regarded as 100 (alternatively, 1 or 10). Alternatively, the dose D(x) may be calculated as an incident dose itself which is obtained by multiplying the reference unnecessary dose by the dose for bias of the solid pattern corresponding to the area of the pixel 36 of the control pixel 27. When generating solid pattern pixel data, the position of each pixel in the pixel data of a defective pattern, the position of each control pixel 27, and the position of the region of each pixel 36 are matched.

Thus, raster data of a defective beam writing pattern (defective pattern: unnecessary exposure pattern) and a dose for bias pattern (solid pattern) being allover uniform is generated. As described above, raster data is generated from a defective beam writing pattern (defective pattern: unnecessary exposure pattern). Then, a solid pattern used for bias irradiation which covers the whole writing region is generated. Moreover, the dose (maximum value) of an unnecessary exposure pattern is calculated as a bias amount. Raster data for a dose for bias being allover uniform is generated from the solid pattern for bias irradiation.

The contents of the writing pattern pixel data generating step (S130) are the same as those of the first embodiment.

In the combining step (S142), the combining unit 61 (combined-value pixel data generation unit) generates, for each control pixel 27, combined-value pixel data by adding values defined in solid pattern pixel data and writing pattern pixel data, and subtracting a value defined in defective pattern pixel data. Specifically, the combining unit 61 adds standardized doses (value corresponding to dose) defined in the solid pattern pixel data and the writing pattern pixel data. Thereby, the whole writing region (here, stripe region 32) is biased (offset) by the dose for bias. However, in this state, since the unnecessary dose of a defective pattern is superfluous, the standardized dose (value corresponding to dose) defined in the defective pattern pixel data is subtracted. Since the standardized dose defined in the solid pattern pixel data has been standardized based on the criterion that the reference dose is regarded as 100 (alternatively, 1 or 10), it can be added as it is. Similarly, since the standardized dose defined in the defective pattern pixel data has been standardized with regarding the reference dose as 100 (alternatively, 1 or 10), it can be subtracted as it is. Alternatively, incident doses defined in the solid pattern pixel data and the writing pattern pixel data are added together, and the incident dose defined in the defective pattern pixel data is subtracted.

In addition, with respect to the addition of the dose of raster data of the solid pattern for bias, when the pixelation grid is an allover uniform grid, since the dose of each pixel for a bias amount is common on the whole surface, it is also possible to omit generating raster data of a solid pattern by adding a specific bias value at the time of adding/subtracting raster data, not by generating a solid pattern.

By irradiating each control pixel 27 with the beam dose based on the combined-value pixel data, as shown in FIG. 18E, an unnecessary dose enters each of the defective patterns 40a to 40d, and a dose for bias enters the portion other than the defective patterns 40a to 40d. Therefore, the whole of the writing region (in this case, the stripe region 32) is biased by the unnecessary dose. Thus, the base of the dose for bias can be formed as if the defective patterns 40a to 40d themselves do not exist.

The contents of each of the steps after the dose calculating step (S144) for each pass are the same as those of the first embodiment.

As described above, when performing writing, for each pixel, the dose of raster data for bias irradiation is added to normal writing data (raster data), and the dose of raster data of a defective beam writing pattern is subtracted. Writing is carried out in the mode which uses only a normal beam in order to secure dose controlling. For suppressing the dose for bias, not to limited to the two pass multiple writing, it is preferable to perform writing using four passes or more while avoiding overlapping with each other among defective beam portions. The dose of raster data for bias irradiation and the dose of raster data of a defective beam writing pattern are distributed to each pass to be added/subtracted. In that case, similarly to the normal writing data, if the dose is uniformly distributed to each pass to be added/subtracted, it does not occur to generate a minus dose by subtraction, and it is possible to simply and efficiently perform processing in terms of controlling.

Thus, according to the second embodiment, when there occurs in the multiple beams 20 a defective beam such as an always-on beam which delivers a dose being larger than a control dose and including an unnecessary dose, writing can be performed with great accuracy by using a solid pattern even not by generating a reverse pattern. Moreover, similarly to the first embodiment, in the case where the position of the control pixel 27 and the irradiation pattern position by a defective beam are displaced from each other, the correction accuracy can be improved compared to the conventional one.

Embodiments have been explained referring to specific examples described above. However, the present invention is not limited to these specific examples.

Figure 19:
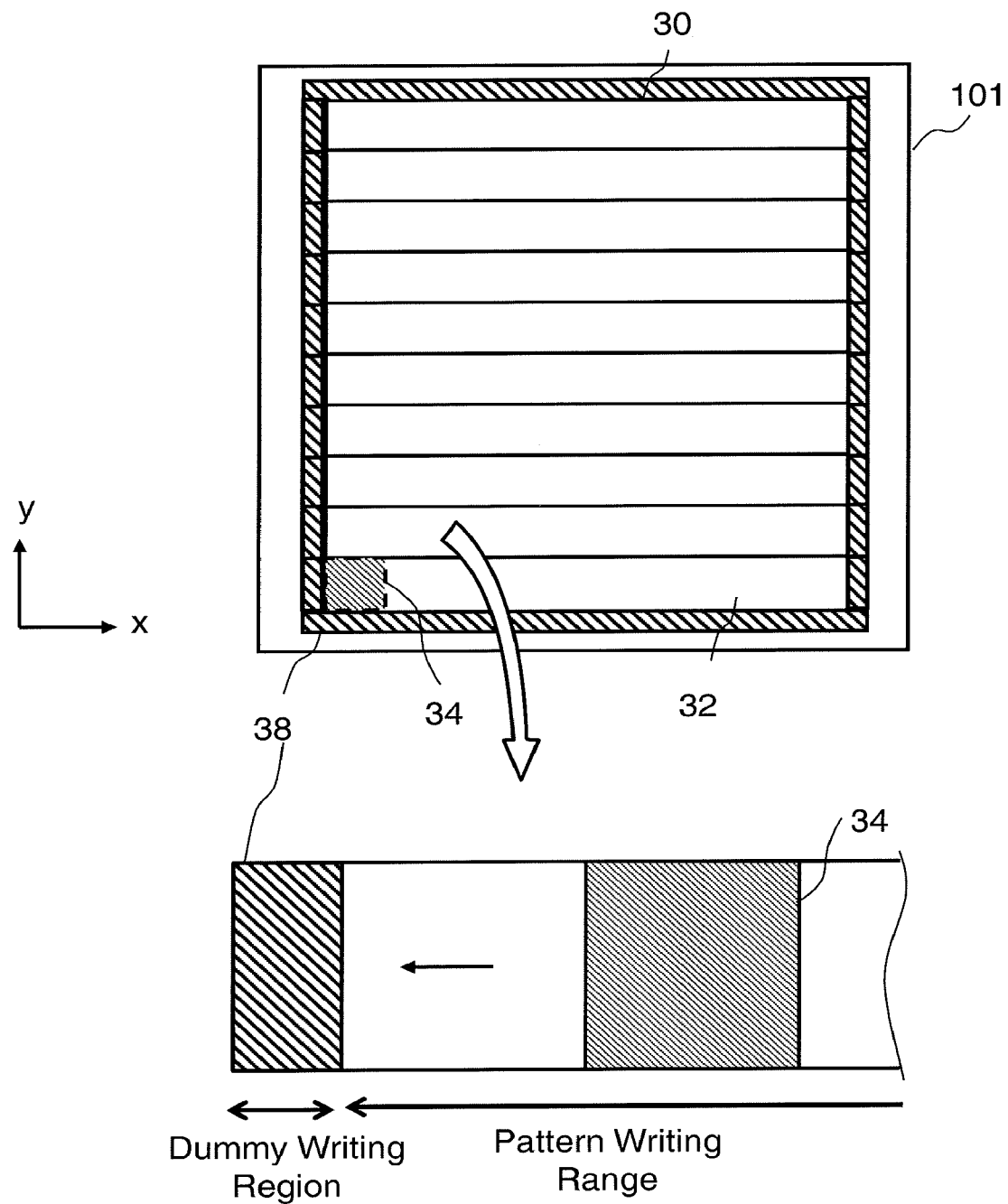
FIG. 19 illustrates a modified example of the writing method of each Embodiment.

FIG. 19 illustrates a modified example of the writing method of each Embodiment. In each Embodiment described above, in addition to a writing pattern, a dose for bias is applied to the target object 101. Therefore, at the end of each stripe region 32, a drastic dose difference occurs between the inside of the stripe region 32 concerned and its outside where no dose for bias is applied. Accordingly, when a writing pattern is formed at the end of each stripe region 32, proximity effect correction may deviate due to the drastic dose difference. Then, as shown in FIG. 19, a dummy pattern 38 is arranged around the writing region 30 of the target object 101. The width of the dummy pattern 38 is sufficient to be equal to or greater than the influence radius of the proximity effect. When performing a writing operation for each stripe region 32, it is preferable to perform the writing while including the dummy pattern 38. Alternatively, after completing the writing processing of the writing region 30, the dummy pattern 38 may be written around the circumference of the writing region 30. It goes without saying that the dose of the dummy pattern 38 is set to be the same as the dose for bias. Since the dose for bias is usually a dose amount which can be applied by one pass, in many cases, it can be written without performing multiple writing. As a matter of course, the dummy pattern 38 may be formed by multiple writing.

As described above, according to the second embodiment, it is preferable, in order to equalize the conditions in the writing region, to perform writing control while having a margin before and after the stripe which is written by continuous movement of the stage. In addition to the case of forming the dummy pattern 38 independently, it is also preferable that a large reverse pattern region (or solid pattern region for bias) is provided before and after the stripe region 32, and writing of a normal pattern is started after the bias writing by using a reverse pattern has been started. Moreover, in order to equalize the conditions of the proximity effect and the like, a solid pattern region for bias is also extended to upper and lower sides of the writing pattern region. Further, in order to avoid unnecessary irradiation at the time of stage moving, such as moving between the stripes, a mechanism for compulsorily making all the beams off by the deflector 212 is provided in each Embodiment. With this mechanism, the following processing can be executed. That is, when the stage moves, the beam is cut off, and when the stripe writing is started, after starting writing a reverse pattern, the mechanism for compulsorily making all the beams off is stopped in order to start beam irradiation, and sequential writing of the normal writing region is started. Then, when the strip writing is finished, the mechanism for compulsorily making all the beams off is started by the procedure reverse to that of the starting time. By such a method, beam irradiation in the uncontrolled state can be avoided, and since a uniform bias writing region is provided around the circumference of a normal writing pattern, equalization of conditions, such as a proximity effect and the like can be achieved even in the periphery of the writing pattern. When forming the dummy pattern 38 or an extended reverse pattern, increase in the data amount can be avoided by defining a portion, whose gradation level is uniform, by a large figure.

Moreover, in each Embodiment described above, it is preferable to perform dose adding by the amount of a reverse pattern or dose adding by the amount of a solid pattern by distributing it to each pass because if the dose adding is collectively performed in one pass, a defective dose in the one pass concerned is increased compared to that of other passes, which results in complicated processing due to different processing for the defective dose depending on a pass.

Moreover, in the example described above, when writing the stripe region 32 by one movement of the stage, a specific portion is irradiated with one beam irradiation. However, depending on a writing mode to be set, it is also possible, as another writing method, to irradiate the same position with beam irradiations of a plurality of times during one stage movement. This method where the same position is irradiated with a plurality of irradiations by a different beam through one pass (one stage movement) can be called a one-pass multiple writing method. For example, in one-pass multiple writing of two times, although the stage movement is once and a specific position is irradiated twice, this is functionally equivalent to the case where raster writing data for two passes is prepared and writing of the two passes is executed simultaneously. Thus, for example, writing can be executed by performing one stage movement (one pass), making the irradiation time half, and distributing the irradiation position to two places (of a pixel). At this time, since the irradiation position of a defective beam is another place, the dose of the defective beam decreases, and the bias level can be reduced by half. Here, if there are a plurality of defective beams, the writing mode needs to be selected so that the irradiation position of the defective beam may not overlap with each other. Since the contrast becomes better if the bias level decreases, the process becomes easier. Thus, the writing mode is also one of choices, and preferably, selection of the writing mode is set according to demand.

Moreover, in view of data management, it is convenient and preferable to individually (independently) maintain defective pattern (unnecessary exposure pattern) data, separately from writing data. What is convenient about this is that when defective pattern (unnecessary exposure pattern) data is maintained individually, if the state of a defective beam changes in the middle of the operation, only the unnecessary exposure pattern needs to be changed depending on the state change, and writing data can be maintained as it is. That is, the amount of data maintained can be suppressed and data attribution is clear, and therefore, it is easy to manage. Particularly, when writing data has a hierarchical structure, if maintained individually, since the hierarchical structure of the writing data can be maintained as it is, the problem of data amount increase due to break of the hierarchical structure can be avoided. Moreover, as for an unnecessary exposure pattern, if the same data compression method as that for writing data is used, the data amount can further be reduced and therefore, the processing can be carried out at high speed.

Moreover, an unnecessary exposure pattern can also be formed, not by evaluating beam positional deviation to form an unnecessary exposure pattern by a defective beam based on the deviation amount, but by writing a test pattern, in a predetermined writing mode, on the substrate with resist applied, evaluating the form dimension of an unnecessary pattern, the resist film decrease amount, and the like, and directly determining the unnecessary irradiation pattern based on the evaluation result. This test pattern may be a specific pattern, and writing (treating dose as 0) may be performed without a pattern.

Moreover, not only in the case of an always-on defective beam, correction can be performed by the same method as described above but also in the case where, at the time of writing, there occurs an unnecessary beam irradiation which is delivered in addition to the beam for writing serving as a control target. For example, if there is exposure by an unnecessary beam due to reflection, scattering, and the like in the optical column, exposure by a leaked beam at the time of blanking, or/and unnecessary exposure (defective beam) due to a reflected scattered electron and the like from the structure at the stage upper part, etc., it is possible to perform correction by equalizing the bias by the same method as described above by way of forming the exposure amount (dose) as an unnecessary irradiation pattern (defective pattern). Such an unnecessary exposure amount can be obtained based on the relation between a beam dose and an unnecessary irradiation (region and intensity (Dose)) at the time of writing, through experiment evaluation, for example. This experiment evaluation can be executed by, for example, writing a test pattern and evaluating a form dimension of an unnecessary pattern, the resist film decrease amount, and the like. If specifying a generation model of an unnecessary exposure amount, based on the relation between the beam dose and the unnecessary irradiation (region and intensity (Dose)) at the time of writing, it is possible in advance to form an unnecessary irradiation pattern by specifying an unnecessary irradiation region (defective region) which is generated in the actual writing, through simulation and the like based on the model. The correction can be executed by either way of generating a reverse pattern of an unnecessary irradiation pattern or using a solid pattern for bias. When correcting unnecessary irradiation generated by unnecessary scattering and the like, if there is no uncontrollable beam in multiple beams, it is not necessary to perform N+1 pass writing, thereby being sufficient to perform N pass writing.

While the apparatus configuration, control method, and the like not directly necessary for explaining the present invention are not described, some or all of them can be selectively used case-by-case basis. For example, although description of the configuration of the control system for controlling the writing apparatus 100 is omitted, it should be understood that some or all of the configuration of the control system can be selected and used appropriately when necessary.

In addition, any other multiple charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing apparatus comprising:
   a defective region specifying circuitry configured to specify a defective region to be irradiated with a defective beam which has a probability of delivering a dose being larger than a control dose and including an unnecessary dose, in a writing region of a target object;
   a defective pattern data generation circuitry configured to generate defective pattern data of a defective pattern having a shape of the defective region in the writing region;
   a reverse pattern data generation circuitry configured to generate reverse pattern data by reversing the defective pattern data;
   a reverse pattern data conversion circuitry configured to convert the reverse pattern data into reverse pattern pixel data which defines a value corresponding to a dose for each pixel;
   a writing pattern data conversion circuitry configured to convert writing pattern data which defines a figure pattern to be written into writing pattern pixel data which defines a value corresponding to a dose for the each pixel;
   a combined-value pixel data generation circuitry configured to generate, for the each pixel, combined-value pixel data by adding the value defined in the reverse pattern pixel data and the value defined in the writing pattern pixel data; and
   a writing mechanism configured to perform multiple writing, using multiple charged particle beams, on the target object such that the each pixel is irradiated with a beam of a dose corresponding to a value defined in the combined-value pixel data.

2. The apparatus according to claim 1, wherein the defective pattern data generation circuitry generates the defective pattern data which defines a plurality of defective patterns, each of which has the unnecessary dose different from each other, and a value corresponding to the unnecessary dose related to each the defective pattern.

3. The apparatus according to claim 1, wherein the writing mechanism performs the multiple writing while shifting a position among a plurality of passes in the multiple writing.

4. The apparatus according to claim 3, wherein the writing mechanism performs, as the multiple writing, passes of preset multiple times, and one additional pass.

5. A multiple charged particle beam writing apparatus comprising:
   a defective region specifying circuitry configured to specify a defective region to be irradiated with a defective beam which has a probability of delivering a dose being larger than a control dose and including an unnecessary dose, in a writing region of a target object;
   a defective pattern data generation circuitry configured to generate defective pattern data of a defective pattern having a shape of the defective region in the writing region;
   a solid pattern data generation circuitry configured to generate solid pattern data in which a whole of the writing region is regarded as a pattern;
   a defective pattern data conversion circuitry configured to convert the defective pattern data into defective pattern pixel data which defines a value corresponding to a dose for each pixel;
   a writing pattern data conversion circuitry configured to convert writing pattern data which defines a figure pattern to be written into writing pattern pixel data which defines a value corresponding to a dose for the each pixel;
   a solid pattern data conversion circuitry configured to convert the solid pattern data into solid pattern pixel data which defines a value corresponding to a dose for the each pixel;
   a combined-value pixel data generation circuitry configured to generate, for the each pixel, combined-value pixel data by adding the value defined in the solid pattern pixel data and the value defined in the writing pattern pixel data, and subtracting the value defined in the defective pattern pixel data; and
   a writing mechanism configured to perform multiple writing, using multiple charged particle beams, on the target object such that the each pixel is irradiated with a beam of a dose corresponding to a value defined in the combined-value pixel data.

6. The apparatus according to claim 5, wherein the defective pattern data generation circuitry generates the defective pattern data which defines a plurality of defective patterns, each of which has the unnecessary dose different from each other, and a value corresponding to the unnecessary dose related to each the defective pattern.

7. A multiple charged particle beam writing method comprising:
   specifying a defective region to be irradiated with a defective beam which has a probability of delivering a dose being larger than a control dose and including an unnecessary dose, in a writing region of a target object;
   generating defective pattern data of a defective pattern having a shape of the defective region in the writing region;
   generating reverse pattern data by reversing the defective pattern data;
   converting the reverse pattern data into reverse pattern pixel data which defines a value corresponding to a dose for each pixel;

converting writing pattern data which defines a figure pattern to be written into writing pattern pixel data which defines a value corresponding to a dose for the each pixel;

generating, for the each pixel, combined-value pixel data by adding the value defined in the reverse pattern pixel data and the value defined in the writing pattern pixel data; and performing multiple writing, using multiple charged particle beams, on the target object such that the each pixel is irradiated with a beam of a dose corresponding to a value defined in the combined-value pixel data.

8. The method according to claim 7, Wherein the defective pattern data defines a plurality of defective patterns, each of which has the unnecessary dose different from each other, and a value corresponding to the unnecessary dose related to each defective pattern.

9. The method according to claim 7, wherein the multiple writing is performed while shifting a position among a plurality of passes in the multiple writing.

10. The method according to claim 9, wherein, as the multiple writing, passes of preset multiple times, and one additional pass, are performed.

11. The method according to claim 7, wherein
irradiation of a pass by the defective beam and irradiation of a plurality of passes by normal beams are applied to a pixel to be irradiated with the defective beam,
the dose corresponding to the value defined in the combined-value pixel data is divided and distributed to a plurality of passes by normal beams, and
a dose zero is set for a pass by the defective beam.

12. A multiple charged particle beam writing method comprising:
specifying a defective region to be irradiated with a defective beam which has a probability of delivering a dose being larger than a control dose and including an unnecessary dose, in a writing region of a target object;
generating defective pattern data of a defective pattern having a shape of the defective region in the writing region;
generating solid pattern data in which a whole of the writing region is regarded as a pattern;
converting the defective pattern data into defective pattern pixel data which defines a value corresponding to a dose for each pixel;
converting writing pattern data which defines a figure pattern to be written into writing pattern pixel data which defines a value corresponding to a dose for the each pixel;
converting the solid pattern data into solid pattern pixel data which defines a value corresponding to a dose for the each pixel;
generating, for the each pixel, combined-value pixel data by adding the value defined in the solid pattern pixel data and the value defined in the writing pattern pixel data, and subtracting the value defined in the defective pattern pixel data; and
performing multiple writing, using multiple charged particle beams, on the target object such that the each pixel is irradiated with a beam of a dose corresponding to a value defined in the combined-value pixel data.

13. The method according to claim 12, wherein the defective pattern data defines a plurality of defective patterns, each of which has the unnecessary dose different from each other, and a value corresponding to the unnecessary dose related to each defective pattern.

14. The method according to claim 12, wherein
irradiation of a pass by the defective beam and irradiation of a plurality of passes by normal beams are applied to a pixel to be irradiated with the defective beam,
the dose corresponding to the value defined in the combined-value pixel data is divided and distributed to a plurality of passes by normal beams, and
a dose zero is set for a pass by the defective beam.

* * * * *